United States Patent
El Ghazzal

(10) Patent No.: US 11,740,856 B2
(45) Date of Patent: Aug. 29, 2023

(54) SYSTEMS AND METHODS FOR RESOLVING OVERLAPPING SPEECH IN A COMMUNICATION SESSION

(71) Applicant: Meta Platforms, Inc., Menlo Park, CA (US)

(72) Inventor: Sammy El Ghazzal, Adliswil (CH)

(73) Assignee: Meta Platforms, Inc., Menlo Park, CA (US)

(*) Notice: Subject to any disclaimer, the term of this patent is extended or adjusted under 35 U.S.C. 154(b) by 163 days.

(21) Appl. No.: 17/143,879

(22) Filed: Jan. 7, 2021

(65) Prior Publication Data

US 2022/0214859 A1 Jul. 7, 2022

(51) Int. Cl.
| | | |
|---|---|---|
| *G06F 3/16* | (2006.01) | |
| *G10L 15/18* | (2013.01) | |
| *G10L 15/22* | (2006.01) | |
| *G10L 25/90* | (2013.01) | |
| *H04N 7/15* | (2006.01) | |

(52) U.S. Cl.
CPC .......... *G06F 3/165* (2013.01); *G10L 15/1815* (2013.01); *G10L 15/22* (2013.01); *G10L 25/90* (2013.01); *H04N 7/15* (2013.01)

(58) Field of Classification Search
CPC .......... G06F 3/167; G06F 3/011; G06F 3/165; G10L 15/22; G10L 2015/227; G10L 15/1815; G10L 25/90; H04R 1/406; H04N 7/15
See application file for complete search history.

(56) References Cited

U.S. PATENT DOCUMENTS

| | | | | |
|---|---|---|---|---|
| 7,185,054 | B1* | 2/2007 | Ludwig | H04L 65/1101 348/E7.083 |
| 9,877,100 | B1* | 1/2018 | Tyagi | G10L 15/22 |
| 2008/0095348 | A1* | 4/2008 | Abernethy | H04M 3/42221 379/202.01 |
| 2009/0060157 | A1* | 3/2009 | Kim | H04M 3/42187 379/202.01 |
| 2012/0128322 | A1* | 5/2012 | Shaffer | G11B 20/10527 386/241 |
| 2013/0339431 | A1* | 12/2013 | Yannakopoulos | H04L 12/1831 709/204 |

(Continued)

FOREIGN PATENT DOCUMENTS

| | | | | |
|---|---|---|---|---|
| CN | 111684820 A | * | 9/2020 | G08B 7/06 |
| EP | 2237533 A1 | | 10/2010 | |

(Continued)

OTHER PUBLICATIONS

European Search Report for European Application No. 21215468.6, dated May 10, 2022, 11 pages.

*Primary Examiner* — Mohammad K Islam
(74) *Attorney, Agent, or Firm* — Sheppard Mullin Richter & Hampton LLP

(57) ABSTRACT

Systems, methods, and non-transitory computer-readable media can be configured to determine first audio associated with a first user and second audio associated with a second user, the first user and the second user associated with a communication session. The second audio can be muted based on a determination that the first audio and the second audio overlap. The second audio can be provided based on completion of the first audio.

20 Claims, 12 Drawing Sheets

(56) References Cited

U.S. PATENT DOCUMENTS

| | | | | |
|---|---|---|---|---|
| 2014/0270200 | A1* | 9/2014 | Usher | G10L 25/78 |
| | | | | 381/74 |
| 2014/0320588 | A1* | 10/2014 | Midtun | H04L 12/1895 |
| | | | | 370/260 |
| 2015/0012270 | A1* | 1/2015 | Reynolds | H04N 7/15 |
| | | | | 704/233 |
| 2015/0280670 | A1* | 10/2015 | Kauffmann | G10L 25/78 |
| | | | | 381/107 |
| 2015/0317123 | A1* | 11/2015 | Wu | H04M 3/568 |
| | | | | 715/727 |
| 2016/0057390 | A1* | 2/2016 | Ramalho | H04L 65/4025 |
| | | | | 348/14.08 |
| 2016/0234268 | A1* | 8/2016 | Ouyang | H04L 67/54 |
| 2017/0279859 | A1* | 9/2017 | Pogorelik | G06F 3/04817 |
| 2017/0318374 | A1* | 11/2017 | Dolenc | H04R 29/004 |
| 2017/0345429 | A1* | 11/2017 | Hardee | G10L 17/06 |
| 2018/0190266 | A1* | 7/2018 | Sun | G10L 15/005 |
| 2018/0295240 | A1* | 10/2018 | Dickins | H04M 3/568 |
| 2018/0336902 | A1* | 11/2018 | Cartwright | G06F 16/61 |
| 2019/0281096 | A1* | 9/2019 | Mazzarella | H04N 7/152 |
| 2020/0112450 | A1* | 4/2020 | Chhabra | H04L 65/403 |
| 2021/0224031 | A1* | 7/2021 | Nair | G10L 15/22 |
| 2022/0028410 | A1* | 1/2022 | Aher | G10L 15/22 |
| 2022/0028412 | A1* | 1/2022 | Aher | G10L 15/1822 |
| 2022/0030302 | A1* | 1/2022 | Chavan | H04N 21/4396 |
| 2022/0131979 | A1* | 4/2022 | Pham | G06F 3/167 |

FOREIGN PATENT DOCUMENTS

| | | | | |
|---|---|---|---|---|
| EP | 2760015 A1 * | 7/2014 | | G06F 3/167 |
| EP | 3188495 A1 * | 7/2017 | | G10K 11/17821 |
| EP | 3448006 A1 * | 2/2019 | | G06F 16/686 |
| TW | I241828 B * | 2/2004 | | G06F 3/011 |
| WO | WO-2020251902 A1 * | 12/2020 | | G06F 3/165 |

* cited by examiner

SYSTEMS AND METHODS FOR RESOLVING OVERLAPPING SPEECH IN A COMMUNICATION SESSION

FIELD OF THE INVENTION

The present technology relates to the field of digital communications. More particularly, the present technology relates to processing of audio content during a communication session.

BACKGROUND

Today, people often utilize computing devices (or systems) for a wide variety of purposes. For example, users can utilize computing devices to access a social networking system or other type of communication platform. The users can utilize the computing devices to interact with one another, share content items, and view content items via the communication platform. In some instances, a user may utilize the communication platform to conduct a communication session, such as a video conference, with other users.

SUMMARY

Various embodiments of the present technology can include systems, methods, and non-transitory computer readable media configured to determine first audio associated with a first user and second audio associated with a second user, the first user and the second user associated with a communication session. The second audio can be muted based on a determination that the first audio and the second audio overlap. The second audio can be provided based on completion of the first audio.

In an embodiment, the muting the second audio is further based on a first topic associated with the first audio and a second topic associated with the second audio.

In an embodiment, the first topic is determined based on first speech included in the first audio, the second topic is determined based on second speech included in the second audio, and the first topic is determined to be more similar to a topic of a discussion associated with the communication session than the second topic.

In an embodiment, the muting the second audio is further based on first user information associated with the first user and second user information associated with the second user.

In an embodiment, the muting the second audio is further based on a first frequency with which the first user speaks in the communication session and a second frequency with which the second user speaks in the communication session, and the second frequency is higher than the first frequency.

In an embodiment, the muting the second audio is further based on a first time associated with the first audio and a second time associated with the second audio, and the first time is earlier than the second time.

In an embodiment, a transcription is provided based on the second audio.

In an embodiment, a notification is provided for users associated with the communication session that a recording of the second audio will be provided.

In an embodiment, provision of the second audio in the communication is a selectable option of the second user.

In an embodiment, the second audio is prioritized over audio of users associated with the communication session after the completion of the first audio.

It should be appreciated that many other features, applications, embodiments, and/or variations of the disclosed technology will be apparent from the accompanying drawings and from the following detailed description. Additional and/or alternative implementations of the structures, systems, non-transitory computer readable media, and methods described herein can be employed without departing from the principles of the present technology.

Figure 1:
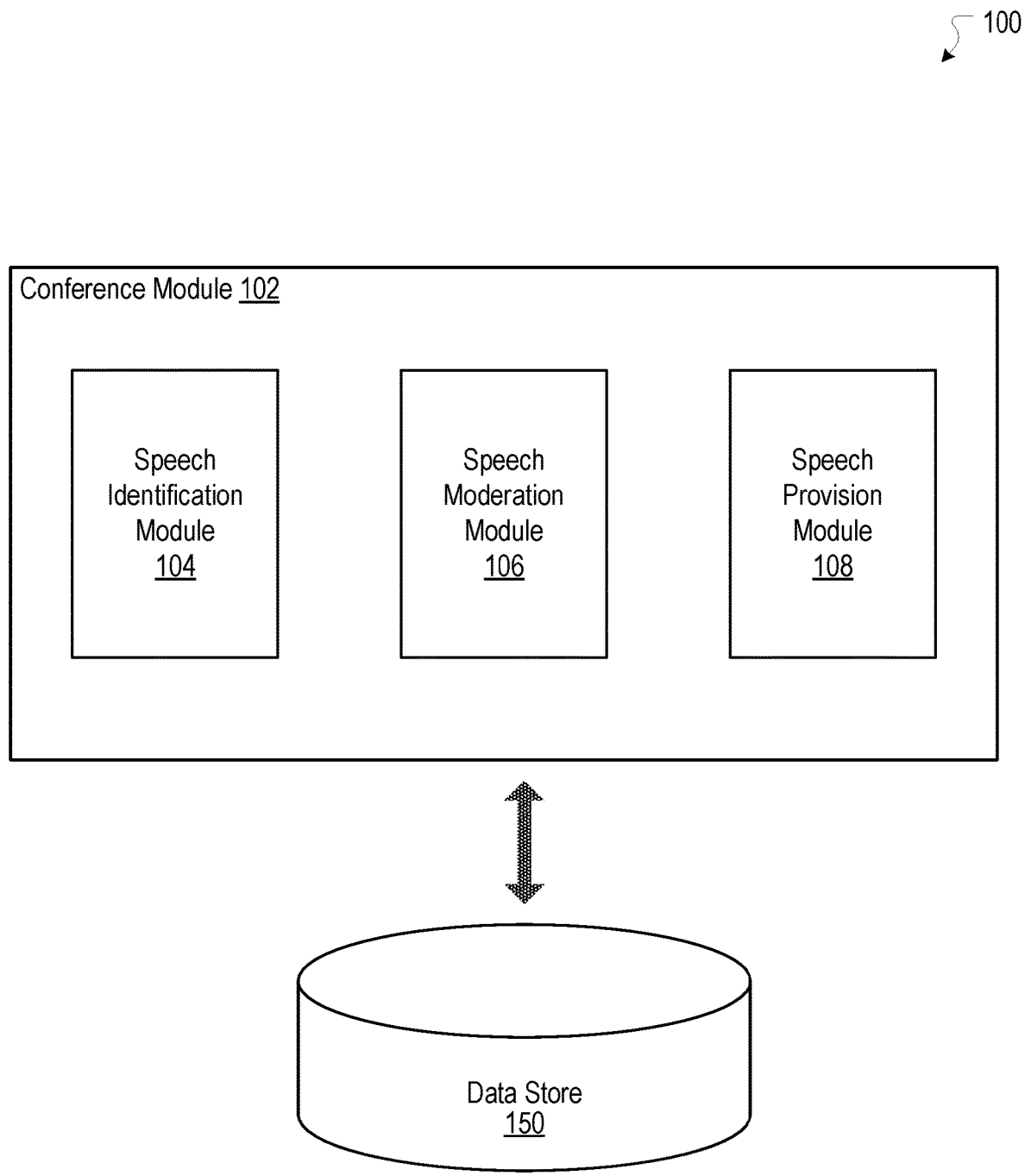
FIG. 1 illustrates an example system including a conference module, according to an embodiment of the present technology.

The figures depict various embodiments of the disclosed technology for purposes of illustration only, wherein the figures use like reference numerals to identify like elements. One skilled in the art will readily recognize from the following discussion that alternative embodiments of the structures and methods illustrated in the figures can be employed without departing from the principles of the present technology described herein.

DETAILED DESCRIPTION

Today, people often utilize computing devices (or systems) for a wide variety of purposes. For example, users can utilize computing devices to access a social networking system or other type of communication platform. The users can utilize the computing devices to interact with one another, share content items, and view content items via the communication platform. In some instances, a user may utilize the communication platform to conduct a communication session, such as a video conference, with other users.

Under conventional approaches, users can interact with other users through a social networking system or other type of communication platform. For example, a user can initiate a video conference. Other users can join the video conference. The user can speak to the other users through the video conference. When the user speaks, audio as well as video from the user is provided to the other users. Various problems can arise during a video conference. For example, during a video conference, multiple users may speak at the same time or otherwise communicate in a manner where their speech overlaps with one another. In some situations, such overlapping speech can result from technical issues, such as diminished network bandwidth and associated latency. Overlapping speech can be unintelligible to the participants in the video conference and negatively impact communication clarity during the video conference. Thus, conventional approaches to video conferencing face problems with regard to overlapping speech. These problems become exacerbated and increase in frequency when more users are involved in a video conference as the likelihood of multiple users speaking at the same time increases with the increase in users. Thus, conventional approaches pose these and other problems arising in computer technology.

An improved approach rooted in computer technology overcomes the foregoing and other disadvantages associated with conventional approaches specifically arising in the realm of computer technology. In various embodiments, the present technology provides for resolving overlapping speech in a communication session (e.g., video conference, audio conference, etc.). For example, a conference server can facilitate a communication session among multiple users. In the communication session, computing devices associated with users can provide audio (e.g., speech) to the conference server, and the conference server can provide the audio to computing devices of the other users in the communication session. During the communication session, a computing device associated with a first user can provide first audio to the conference server, and a computing device associated with a second user can provide second audio to the conference server. The first audio can be associated with speech of the first user during a first time duration. The second audio can be associated with speech of the second user during a second time duration that is the same as or to some extent overlaps with the first time duration. For example, the first user and the second user both can be speaking at the same time. The conference server can determine that the first user and the second user are both speaking at the same time based on the first audio overlapping in time with the second audio. In some cases, the conference server can mute the first user or the second user to avoid or minimize the overlapping speech and to optimize communication clarity during the communication session. For example, the first user can have started speaking before the second user, and, in one implementation, the conference server can choose to mute the second user based on the first user speaking before the second user. For example, audio from the second user can be stored for later provision to other users in the communication session after the first user concludes speaking. In other implementations, the present technology also provides other approaches to choose which user to mute based on, for example, user information, a topic reflected in speech, a topic of the communication session, metrics associated with users in the communication session, etc., as discussed in more detail herein.

The conference server can provide in real time or near real time the first audio to the users in the communication session. Instead of providing the second audio in real time or near real time, the conference server can store the second audio. After the first audio is provided to the users, the conference server can provide the stored second audio to the users in the communication session. The present technology also provides other approaches for providing content associated with the stored second audio. For example, a transcription of the second audio can be provided to the users. By providing the first audio to the users in the communication session and thereafter providing the second audio or its content to the users, overlapping speech during the communication session and its associated problems can be addressed and resolved. More details relating to the present technology are provided below.

FIG. 1 illustrates an example system 100 including a conference module 102, according to an embodiment of the present technology. As shown in the example of FIG. 1, the conference module 102 can include a speech identification module 104, a speech moderation module 106, and a speech provision module 108. In some instances, the example system 100 can include at least one data store 150 in communication with the conference module 102. The components (e.g., modules, elements, etc.) shown in this figure and all figures herein are exemplary only, and other implementations may include additional, fewer, integrated, or different components. Some components may not be shown so as not to obscure relevant details. In various embodiments, one or more of the functionalities described in connection with the speech identification module 104, the speech moderation module 106, and the speech provision module 108 can be implemented in any suitable combinations. While the conference module 102 is sometimes herein discussed in connection with a social networking system for purposes of illustration, the conference module 102 of the present technology can be used in or for any other type of communication platform that can support a communication session, such as a video conferencing system, audio conferencing system, etc. For example, the conference module 102 can be implemented in a suitable server system, such as a conference server. As discussed in more detail herein, the conference module 102 manages audio provided by users in a communication session to enhance communication clarity. As discussed herein, "audio" can variously refer to sound, a signal (e.g., digital signal) encoded with sound, or a waveform representative of sound, depending on the context of the reference.

In various embodiments, the conference module 102 can be implemented, in part or in whole, as software, hardware, or any combination thereof. In general, a module as discussed herein can be associated with software, hardware, or any combination thereof. In some implementations, one or more functions, tasks, and/or operations of modules can be carried out or performed by software routines, software processes, hardware, and/or any combination thereof. In some instances, the conference module 102 can be, in part or in whole, implemented as software running on one or more computing devices or systems, such as on a server system or a client computing device. In some instances, the conference module 102 can be, in part or in whole, implemented within or configured to operate in conjunction with or be integrated with a social networking system (or service), such as a social networking system 630 of FIG. 6. Likewise, in some instances, the conference module 102 can be, in part or in whole, implemented within or configured to operate in conjunction with or be integrated with a client computing device, such as the user device 610 of FIG. 6. For example, the conference module 102 can be implemented as or within a dedicated application (e.g., app), a program, or an applet running on a user computing device or client computing system. The application incorporating or implementing instructions for performing functionality of the conference module 102 can be created by a developer. The application can be provided to or maintained in a repository. In some instances, the application can be uploaded or otherwise transmitted over a network (e.g., Internet) to the repository. For example, a computing system (e.g., server) associated with or under control of the developer of the application can provide or transmit the application to the repository. The repository can include, for example, an "app" store in which the application can be maintained for access or download by a user. In response to a command by the user to download the application, the application can be provided or otherwise transmitted over a network from the repository to a computing device associated with the user. For example, a computing system (e.g., server) associated with or under control of an administrator of the repository can cause or permit the application to be transmitted to the computing device of the user so that the user can install and run the application. The developer of the application and the administrator of the repository can be different entities in some cases, but can be the same entity in other cases. It should be understood that many variations are possible.

The conference module 102 can be configured to communicate and/or operate with the data store 150, as shown in the example system 100. The data store 150 can be configured to store and maintain various types of data. In some implementations, the data store 150 can store information associated with the social networking system (e.g., the social networking system 630 of FIG. 6). The information associated with the social networking system can include data about users, user identifiers, social connections, social interactions, profile information, demographic information, locations, geo-fenced areas, maps, places, events, pages, groups, posts, communications, content, feeds, account settings, privacy settings, a social graph, and various other types of data. In some embodiments, the data store 150 can store information that is utilized by the conference module 102. For example, the data store 150 can store information associated with a video conference. It is contemplated that there can be many variations or other possibilities.

In various embodiments, the speech identification module 104 can extract audio information from data (e.g., communication signal) provided by a computing device associated with a user in a communication session. The data may contain other types of information, such as video information. The speech identification module 104 can determine whether audio provided by the user includes speech spoken by the user. Audio provided by a user during a communication session can include speech spoken by the user as well as audio from other sources (e.g., background noise, ambient noise, etc.). In some cases, the audio provided by the user does not include speech of the user but rather only includes audio from other sources. The audio can be determined to include speech when audio amplitude (e.g., volume) of the audio satisfies a threshold audio amplitude. The audio can be determined to not include speech when the audio amplitude of the audio does not satisfy the threshold audio amplitude. As one example, the threshold audio amplitude can be based on an average of the audio amplitude of the audio for a predetermined amount of time. The average of the audio amplitude for the predetermined amount of time can be associated with when the user is not speaking and can include, for example, background noise. In some embodiments, the speech identification module 104 can determine that audio provided by a user includes speech based on a signal to noise ratio associated with the audio. Many variations are possible.

The speech identification module 104 can determine that audio provided by a user includes speech based on a voice classifier. The voice classifier can be trained to differentiate speech from other sounds. The voice classifier can be applied to the audio to generate a score associated with a likelihood that the audio includes speech. The audio can be determined to include speech based on the score satisfying a threshold score relating to a selected confidence level regarding the inclusion of speech in audio. A voice classifier can be trained based on training data that includes, for example, audio of speech and audio of other sounds, and corresponding labels. Positive training data for the voice classifier can include the audio of the speech and negative training data can include the audio of the other sounds. Once trained, the voice classifier can be applied to audio to generate a score based on a likelihood that the audio includes speech. For example, during a communication session, audio can be received from multiple users in the communication session. The audio from each user can be sampled, and a voice classifier can be applied to each audio sample. The voice classifier can generate a score for each audio sample associated with a likelihood that the audio sample includes speech. The audio samples with scores that satisfy a threshold score can be determined to include speech.

In some cases, the speech identification module 104 can determine that audio provided by a user includes speech based on a video associated with the audio. Whether the user is speaking can be determined based on visual signals, such as whether body movements of the user are indicative of speech. The speech identification module 104 can identify and analyze body movement of a user in a video based on a visual classifier. Based on body movement of the user in the video, the visual classifier can generate a score indicative of a likelihood that the movement corresponds with the user speaking. The user can be determined to be speaking when the score satisfies a threshold score. A visual classifier can be trained based on training data that includes, for example, images and videos of the human body or portions thereof (e.g., mouths) while speaking and not speaking, along with associated labels. Positive training data can include images and videos of the human body while speaking (e.g., mouth movement, hand gesturing, etc.). Negative training data can include images and videos of the human body performing non-speaking actions (e.g., smiling, frowning, etc.) or no actions. Many variations are possible. Once trained, the visual classifier can be applied to a video to generate a score indicative of a likelihood that the input video depicts a user speaking.

The speech identification module 104 can determine whether users are speaking during a communication session based on the approaches described herein, individually or in combination. By determining whether the users are speaking during the communication session, instances when multiple users are speaking at the same time or when their speech otherwise overlaps can be identified.

In various embodiments, the speech moderation module 106 can manage audio from multiple users in a communication session. During a communication session, audio containing speech can be received from multiple users. The audio from multiple users can be associated with time information. The time information for audio from each user can indicate a time duration in which the audio occurred. For example, a signal representing audio can be divided into frames having timestamps that define a time duration of the audio. The speech moderation module 106 can analyze the time durations from audio of different users and, based on time durations of different users that temporally overlap, determine overlap in speech by the different users.

In response to a determination of overlapping speech by different users in a communication session, the speech moderation module 106 can selectively cause audio of a user to be provided in real time (or near real time) to other users in a communication session or cause the audio of the user to be muted. For example, a first user in the communication session can speak and, while the first user is speaking, a second user in the communication session can also speak. The speech moderation module 106 can receive first audio from the first user, and can receive second audio from the second user. Based on time information of the first audio and the second audio, the speech moderation module 106 can determine speech overlap between them. The speech moderation module 106 can manage the communication session by providing in real time (or near real time) the first audio to the other users in the communication session and delaying provision of the second audio to the other users. In some cases, the speech moderation module 106 can store the second audio and provide the second audio to the other users after transmission of the first audio to the other users is completed. For example, first audio can be determined to be completed after a threshold amount of time has elapsed without a detection of speech in the first audio.

In response to a determination of overlapping speech, the speech moderation module 106 can select a user to mute in a communication session based on a time associated with when audio is provided by the user. The time associated with when the audio is provided can be based on a timestamp associated with when the audio is provided by the user. For example, the time associated with when the audio is provided can be based on when the audio is received, for example, by a conference server or other server system that is managing the communication session. A user that provides audio associated with a time that is later than a time associated with when another user provides audio can be selected to be muted. The user can be muted for as long as the other user is providing audio. For example, a first user can speak and first audio associated with speech of the first user can be received by the speech moderation module 106. While the first user is speaking, a second user can speak, and second audio associated with speech of the second user can be received by the speech moderation module 106. The first audio can be associated with a first time when the first audio is received by the conference server. The second audio can be associated with a second time when the second audio is received by the conference server. In this example, the first time can be earlier than the second time. Based on the chronology of the first time and the second time, the conference server can cause the first audio to be provided in real time and delay provision of the second audio to the other users in the communication session.

The speech moderation module 106 can select a user to mute based on user information associated with the user. The user information can indicate, for example, a topic on which the user is an expert, a role (e.g., meeting leader, main speaker, division supervisor, etc.) of the user, or other attributes associated with the user. Based on the user information, audio provided by one user can be prioritized over audio provided by another user. For example, a user participating in a communication session can be a speaker invited to the communication session to provide information on a topic to other users. User information associated with the speaker can indicate that the speaker is an expert on the topic and is an invited speaker. Based on the user information, the speech moderation module 106 can prioritize audio provided by the speaker over audio provided by the other users. At some point during the communication session, the speaker and another user may both speak at approximately the same time. In this case, audio from the speaker can be provided in real time to the other users while provision of audio from the other user can be delayed.

The speech moderation module 106 can select a user to mute based on speech included in audio provided by the user. The speech included in the audio provided by the user can indicate a topic associated with the speech. The topic can be determined based on, for example, keywords included in the speech or other natural language processing techniques. The speech in the audio provided by the user and other users can also indicate a topic associated with a discussion or conversation in a communication session. The speech moderation module 106 can determine a topic associated with a discussion in a communication session and determine a topic associated with speech included in audio provided by a user. The speech moderation module 106 can prioritize or mute the audio provided by the user based on the topic associated with the speech and the topic associated with the discussion. Audio that includes speech associated with a topic that is more closely related to a topic associated with a discussion can be prioritized over audio that includes speech associated with a topic that is less closely related to the topic associated with the discussion. The audio that includes the speech associated with the topic that is less closely related to the topic associated with the discussion can be delayed in favor of the audio that includes the speech associated with the topic that is more closely related to the topic associated with the discussion. For example, during a communication session, users can provide audio that includes speech. Based on the speech, the speech moderation module 106 can determine that a discussion in the communication session is associated with a particular topic. In this example, a first user can speak and provide first audio, and a second user can speak and provide second audio. The speech moderation module 106 can determine a first topic associated with the first audio based on keywords identified in speech included in the first audio. The speech moderation module 106 can determine a second topic associated with the second audio based on keywords identified in speech included in the second audio. The speech moderation module 106 can determine that the first topic is more closely related to the particular topic of the discussion than the second topic. Based on the first topic being more closely related to the particular topic of the discussion than the second topic, the speech moderation module 106 can cause the first audio to be provided to the other users in the communication session and delay provision of the second audio to the other users in the communication session.

The speech moderation module 106 can select a user to mute based on metrics or statistics associated with a communication session. During the communication session, metrics can be maintained based on, for example, a frequency with which the user speaks, an aggregate speaking time of the user, a number of times audio from the user was prioritized over audio from other users, and other data. Based on the metrics associated with the communication session, the speech moderation module 106 can prioritize audio from some users over audio from other users. For example, a user that speaks at a lower frequency, has a lower aggregate speaking time, or is associated with a lower number of times of being prioritized over other users can be prioritized over another user that speaks at a higher frequency, has a higher aggregate speaking time, or is associated with a higher number of times of being prioritized over the other users. Audio from the other user that speaks at the higher frequency, has the higher aggregate speaking time, or is associated with the higher number of times of being prioritized over the other users can be muted in favor of audio from the user that speaks at the lower frequency, has the lower aggregate speaking time, or is associated with the lower number of times of being prioritized over other users. For example, a first user can speak at a higher frequency than other users in a communication session. The first user can also speak more quickly than the other users in the communication session and thus, in some instances, be prioritized over the other users a higher number of times than the numbers of times the other users have been prioritized. A second user can speak at a lower frequency than the other users in the communication session, and the second user can speak more slowly than the other users and thus be prioritized a fewer number of times than the other users. In this example, the first user and the second user can both provide audio to the server system. When speech of the first user and the second user overlap, the speech moderation module 106 can prioritize audio from the second user over audio from the first user based on the lower frequency of speaking associated with the second user and the fewer number of times the second user has been prioritized. As a result, provision of the audio from the first user can be delayed. As another example, a first user can speak for relatively longer periods of time than other users in a communication session. By speaking for longer periods of time, the first user can have a higher aggregate speaking time than the other users in the communication session. A second user can speak for relatively shorter periods of time than the other users in the communication session and have a lower aggregate speaking time than the other users. In this example, when speech from the first user and speech from the second user overlap, the speech from the second user can be prioritized over the speech from the first user. This capability helps to achieve similar amounts of speaking time among various users in a communication session, which can be desirable in various contexts and implementations (e.g., a communication session associated with a debate in which participants should have similar or equal speaking times).

The speech moderation module 106 can select a user to mute or a user to prioritize based on machine learning methodologies. The speech moderation module 106 can train a machine learning model and use the machine learning model during a communication session to select a user to mute or prioritize. The machine learning model can be trained based on training data that includes, for example, user information associated with users in a communication session (e.g., user attributes), speech in audio associated with the users in the communication session (e.g., topics), and metrics associated with the users involved in the communication session (e.g., speaking frequency, number of times muted). Additional details regarding such data has been discussed herein. The training data can also include feedback from the users involved in the communication session. Certain feedback can indicate that users were appropriately muted (or prioritized) and other feedback can indicate that users were not appropriately muted (or prioritized). For example, positive training data can include training data associated with the users who were muted with positive feedback, while negative training data can include training data associated with the users who were muted with negative feedback. Once trained, the machine learning model can be used during a communication session to select a user to mute when there is overlapping speech. For example, the machine learning model can select a user to mute in a communication session based on user information associated with users in the communication session, speech in audio associated with the users in the communication session, and metrics associated with the users involved in the communication session. After the communication session, the users, including users who were muted, can provide feedback as to whether muting of the users was appropriate or not. The machine learning model can be further re-trained based on the feedback. Many variations are possible.

The speech moderation module 106 can select one or more users to mute based on the approaches described herein, individually or in combination. For example, a communication session can involve a speaker to lecture about a topic and users interested in the topic. During the communication session, overlapping speech in audio from the speaker, a first user, and a second user can be provided to the speech moderation module 106. Audio from the speaker can be prioritized over audio from the first user and audio from the second user based on user information associated with the speaker indicating that the speaker is an expert on the topic. Audio from the first user can be prioritized over audio from the second user, for example, based on an earlier time associated with when the audio from the first user was received compared to a later time associated with when the audio from the second user was received. In this example, the audio from the speaker is provided to other users in the communication session before the audio from the first user and the audio from the second user. Subsequently, the audio from the first user can be provided before the audio from the second user. Continuing this example, the first user, during the communication session can ask a question that is off-topic. The second user can ask a question that is on-topic. In this example, the audio that includes the off-topic question can be associated with a time that is earlier than a time associated with the audio that includes the on-topic question. Despite their chronology, the audio from the second user that includes the on-topic question can be prioritized over the audio from the first user that includes the off-topic question. Accordingly, the audio from the second user can be provided to the other users in the communication session and provision of the audio from the first user can be delayed.

In some embodiments, the speech moderation module 106 can allow an administrator of a communication session (e.g., meeting leader) or participants in the communication session to configure preferences relating to muting of users during the communication session. For example, an administrator or participant can be provided with options to select one or any combination of the approaches described herein to apply preferences or rules regarding the muting of users. As another example, the administrator or participant can be provided with an option to define a hierarchy of some or all users in a communication session so that speech of a user who is higher in the hierarchy is prioritized over speech of another user who is lower in the hierarchy. Many variations are possible.

In various embodiments, the speech provision module 108 can provide options for providing audio from a user that has been muted. When a user has been muted, the speech provision module 108 can provide a notification to the user indicating that the user has been muted to avoid overlapping speech. The notification can include options for providing the audio from the user to other users in the communication session. The options can include storing a recording of the audio. When audio from another user who was prioritized over the user is completed, the recording can be provided to the other users in the communication session. In some cases, the recording can be provided at an increased playback speed (e.g., 1.5×, 2×, 3×, etc.). The notification provided to the user can also provide a preview of the recording. The options in the notification can also include providing a transcription of the audio. The transcription can be provided, for example, in a chat or other area in a user interface designated for message exchange among users in the communication session. The notification provided to the user can also provide a preview of the transcription. The options in the notification can also include providing priority to the user so that the user can be heard next. When the audio from the other user who was prioritized over the user is completed, the user will have priority to speak. If another user provides additional audio while the user is speaking, the other user will be muted.

When a user in a communication session has been muted, the speech provision module 108 can provide notifications to other users in the communication session to indicate that the user has been muted and to indicate an option selected by the user for providing audio from the user. For example, in the event of overlapping speech in a communication session, a user can be muted in favor of another user who is prioritized over the user. Audio from the user can be stored. The user can be provided with a notification indicating that the user was muted. The notification can include options associated with the stored audio. In this example, the user can select an option to have the stored audio played back to the other users in the communication session after the user who was prioritized over the user is finished speaking. The other users in the communication session can be provided with a contemporaneous notification indicating that the user was muted and that a recording of the audio from the user will be provided. When the user who was prioritized over the user is finished speaking, the recording can be provided to the other users. Many variations are possible.

Figure 2:
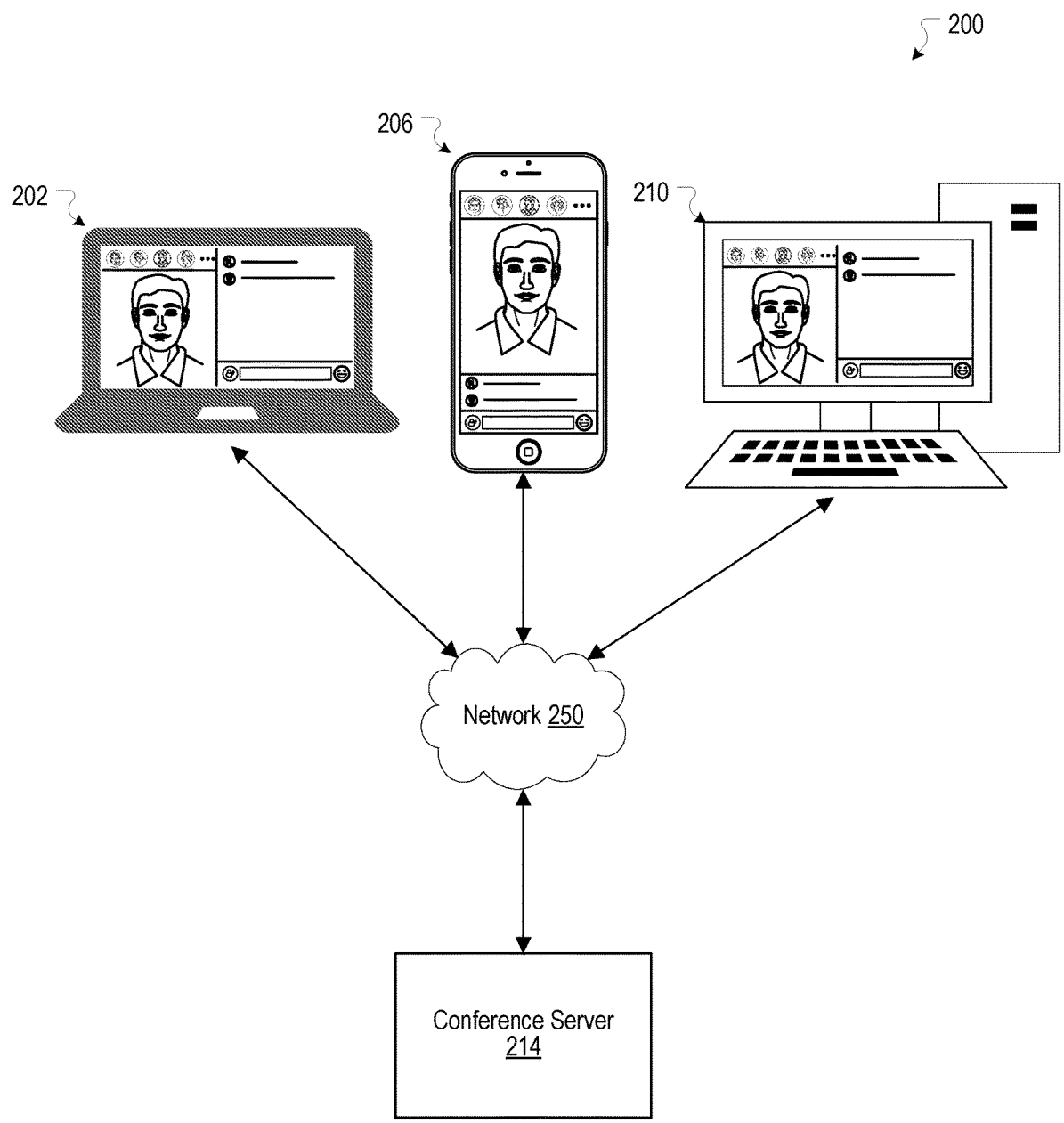
FIG. 2 illustrates an example communication session including a conference server in which the conference module is implemented, according to an embodiment of the present technology.

FIG. 2 illustrates an example system 200, according to an embodiment of the present technology. The example system 200 illustrates an example communication session hosted by a conference server 214 that can implement the functionality of the conference module 102 of FIG. 1. It should be understood that there can be additional, fewer, or alternative steps performed in similar or alternative orders, or in parallel, based on the various features and embodiments discussed herein unless otherwise stated.

In the example system 200, a first device 202 associated with a first user, a second device 206 associated with a second user, and a third device 210 associated with a third user are involved in a communication session, such as a video conference. Although the first device 202, the second device 206, and the third device 210 are illustrated as a laptop computer, a mobile (smart) phone, and a desktop computer, respectively, the present technology applies to any combination of any types of computing systems or devices that can be used by users to participate in a communication session. The first device 202, the second device 206, and the third device 210 communicate with the conference server 214 via a network 250. The first device 202, the second device 206, and the third device 210 can provide audio and video from the first user, the second user, and the third user, respectively, to the conference server 214. Through the conference server 214, each device also can receive audio and video from the other devices in the video conference. The conference server 214 can manage the video conference by applying the various approaches to selectively mute a user after a determination of overlapping speech between the user and another user in the communication session, as discussed herein. All examples herein are provided for illustrative purposes, and there can be many variations and other possibilities.

Figure 3:
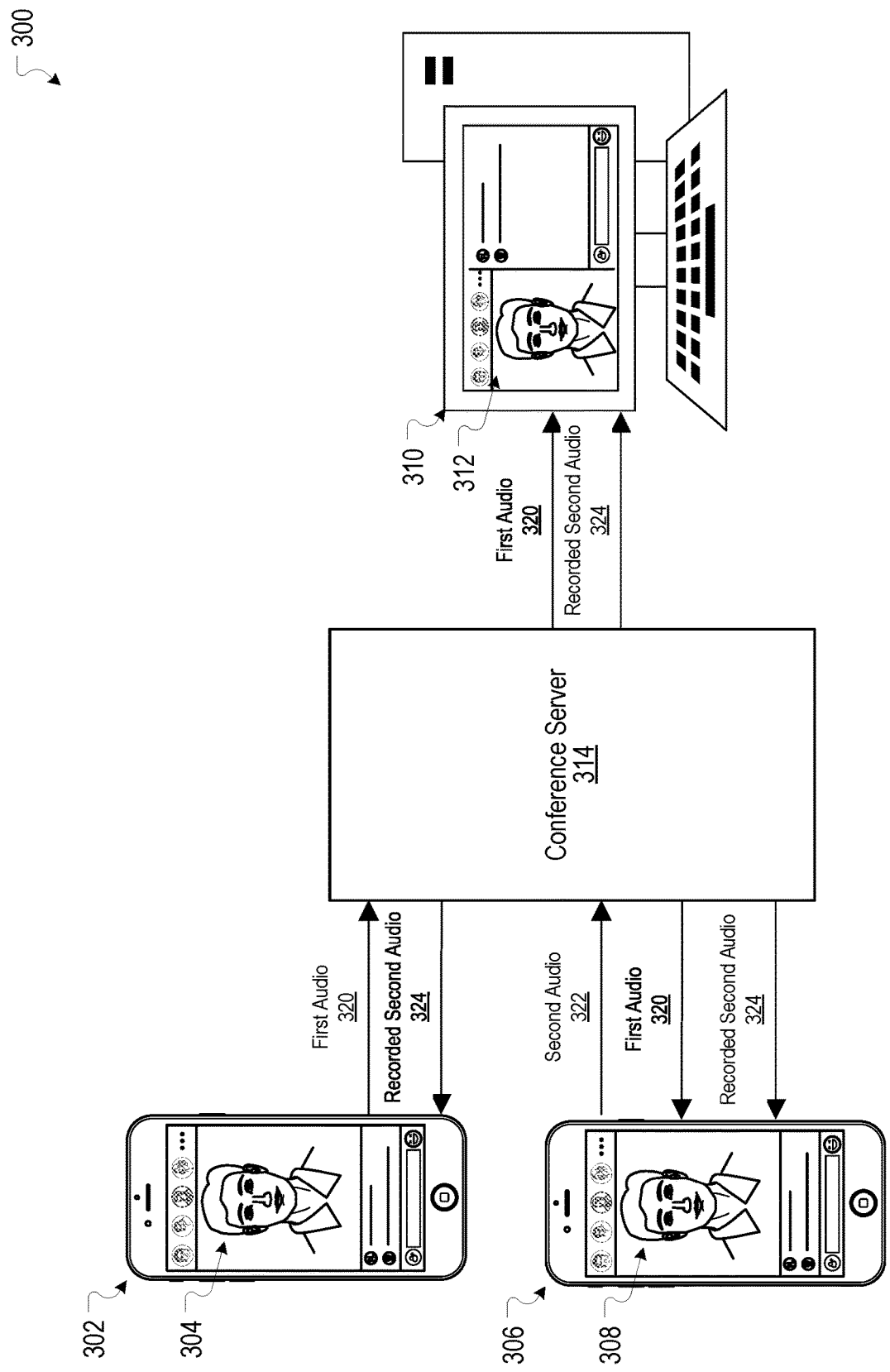
FIG. 3 illustrates an example functional block diagram, according to an embodiment of the present technology.

FIG. 3 illustrates an example functional block diagram 300, according to an embodiment of the present technology. The example functional block diagram 300 illustrates a video conference that can be facilitated by the conference module 102 of FIG. 1. It should be understood that there can be additional, fewer, or alternative steps performed in similar or alternative orders, or in parallel, based on the various features and embodiments discussed herein unless otherwise stated.

In the example block diagram 300, a first device 302, a second device 306, and a third device 310 are involved in a communication session, such as a video conference. The communication session can be managed by a conference server 314 in which the conference module 102 can be implemented. During the communication session, the first device 302 through a first interface 304 can provide first audio 320 to the conference server 314. The second device 306 through a second interface 308 can provide second audio 322 to the conference server 314. The conference server 314 can determine that the first audio 320 and the second audio 322 contain speech and temporally overlap. As a result, the conference server 314 can prioritize the first audio 320 over the second audio 322. Prioritization of the first audio 320 over the second audio 322 can be based on various approaches discussed herein, such as topic similarity. For example, a topic associated with speech included in the first audio 320, a topic associated with speech included in the second audio 322, and a topic of a conversation associated with the communication session can be determined. The first audio 320 can be prioritized over the second audio 322 after a determination that the first audio 320 is more topically similar or relevant to the topic of the conversation associated with the communication session than the second audio 322. Based on the prioritization of the first audio 320 over the second audio 322, the conference server 314 provides the first audio 320 to the second device 306 and the third device 310. The second interface 308 of the second device 306 accordingly displays the user associated with the first audio 320 and outputs the first audio 320. A third interface 312 of the third device 310 accordingly displays the user associated with the first audio 320 and outputs the first audio 320. Instead of immediately providing the second audio 322 to the first device 302 and the third device 310, the conference server 314 can store the second audio 322 as a recorded second audio 324. After the first audio 320 is provided to the second device 306 and the third device 310, the conference server 314 can provide the recorded second audio 324 to the first device 302, the second device 306, and the third device 310. All examples herein are provided for illustrative purposes, and there can be many variations and other possibilities.

FIGS. 4A-4F illustrate example interfaces generated by computing devices associated with users participating in a communication session, according to an embodiment of the present technology. The example interfaces can be associated with one or more functionalities performed by the conference module 102 of FIG. 1. It should be understood that there can be additional, fewer, or alternative steps performed in similar or alternative orders, or in parallel, based on the various features and embodiments discussed herein unless otherwise stated.

Figure 4A:
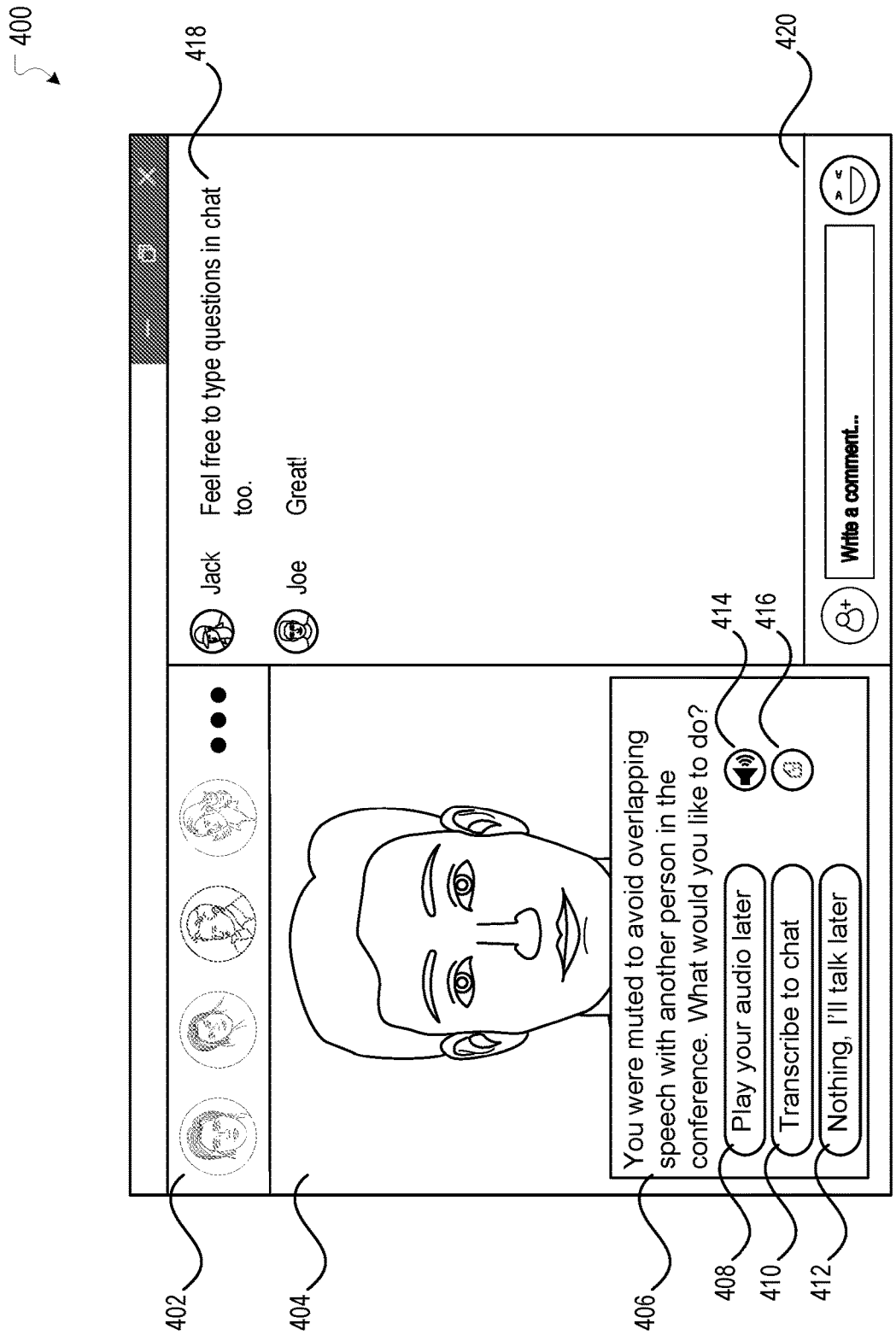
FIGS. 4A-4F illustrate example interfaces, according to an embodiment of the present technology.

FIG. 4A illustrates an example interface 400, according to an embodiment of the present technology. The example interface 400 displays various elements associated with a communication session (e.g., video conference). The example interface 400 can include users 402 who are participating in the communication session. The example interface 400 can also include a video 404 associated with a user that is speaking in the communication session. The example interface 400 can also include a chat 418. The example interface 400 can also include a text entry box 420 for typing messages to the chat 418. The example interface 400 can be presented to a user who was muted. Based on the user being muted, the example interface 400 includes a notification 406 that indicates that the user was muted. The notification 406 can include a first option 408 to play a recording of audio the user provided later in the communication session (e.g., after the current speaker is finished speaking). The notification 406 can include a first button 414 to listen to a preview of the recording of the audio. The notification 406 can also include a second option 410 to transcribe the audio the user provided and provide the transcription to the chat 418. The notification 406 can include a second button 416 to see a preview of the transcription. The notification 406 can also include a third option 412 to not play the recording and not provide the transcription.

Figure 4B:
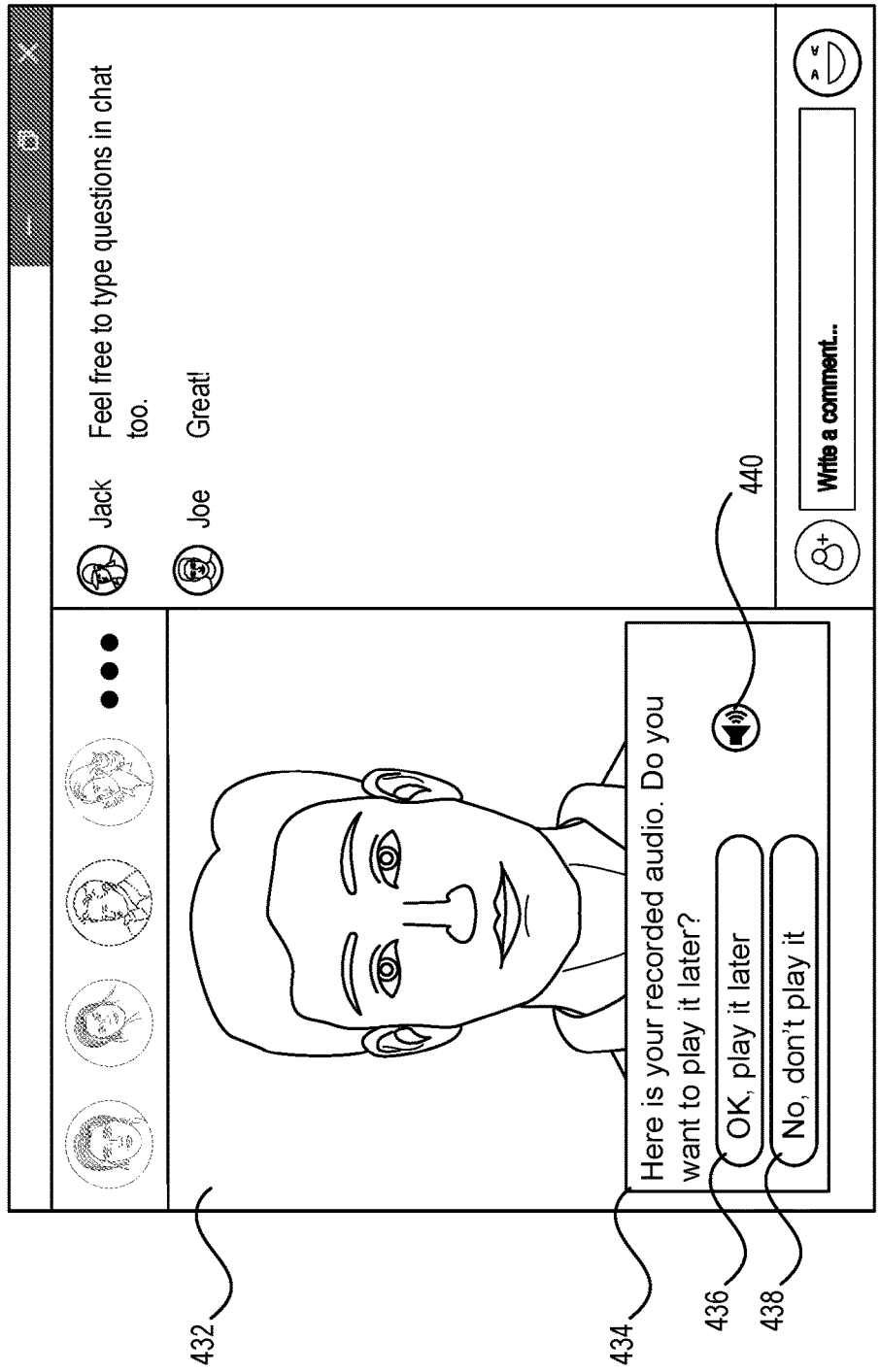

FIG. 4B illustrates an example interface 430, according to an embodiment of the present technology. In some cases, the example interface 430 can be provided in response to a selection by a user of the first option 408 in FIG. 4A to play a recording of audio provided by the user. The example interface 430 can be presented to a user who was muted. In this example, the example interface 430 provides a video 432 of the ongoing communication session. The example interface 430 also includes a notification 434 that indicates that the recording of the audio provided by the user will be played for the other users in the communication session. The notification 434 includes a button 440 to listen to a preview of the recording of the audio. The notification 434 includes a first option 436 to confirm playing the recording of the audio provided by the user for the other users in the communication session. The notification 434 also includes a second option 438 to decline playing the recording of the audio.

Figure 4C:
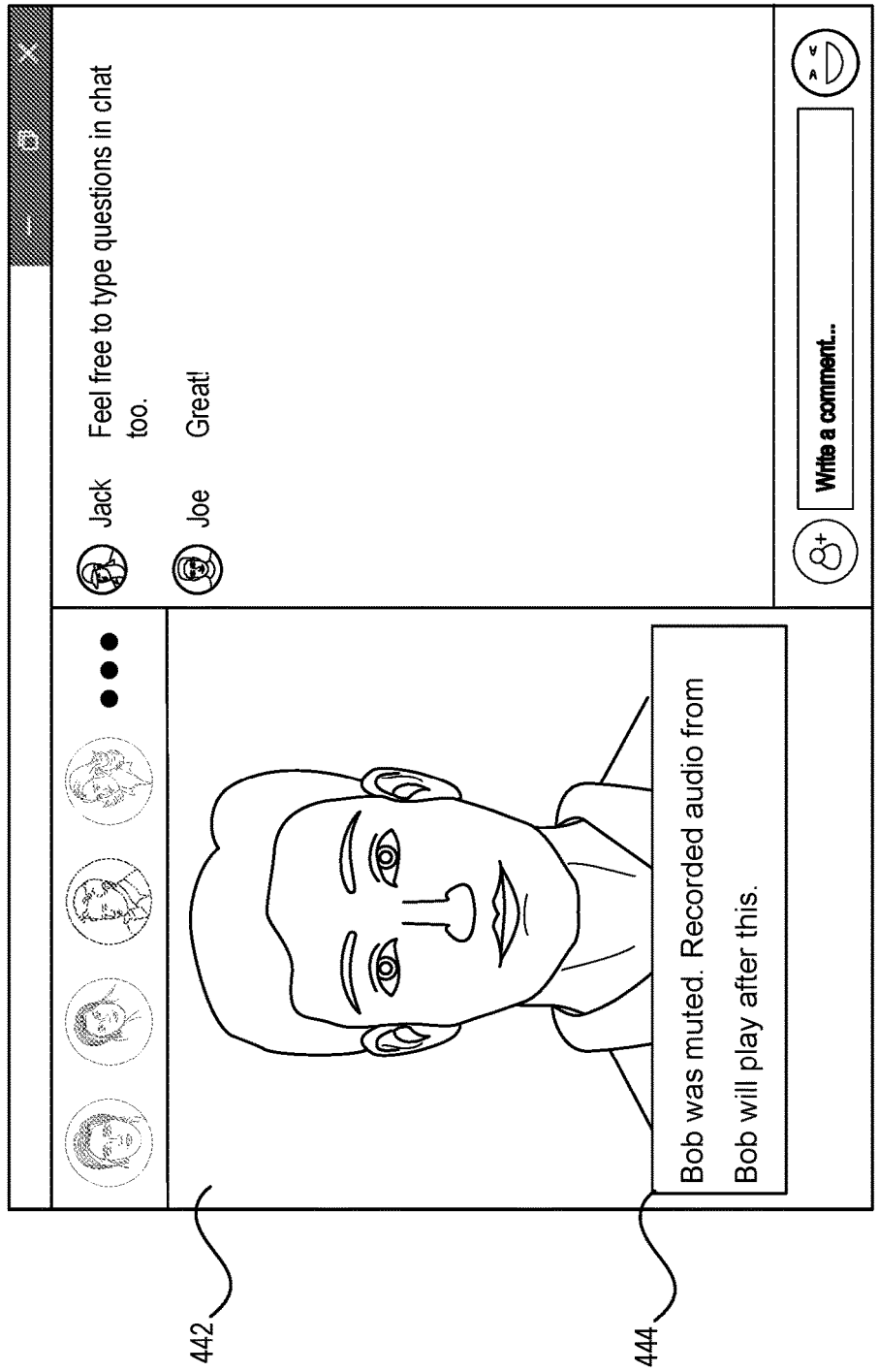

FIG. 4C illustrates an example interface 440, according to an embodiment of the present technology. In some cases, the example interface 440 can be provided in response to a selection by a user of the first option 436 in FIG. 4B to play a recording of audio provided by the user. The example interface 430 can be provided to other users in a communication session with the user. In this example, the example interface 430 can include a video 442 of the ongoing communication session. The example interface 430 can include a notification 444 indicating that the user was muted and that a recording of audio provided by the user will be played.

Figure 4D:
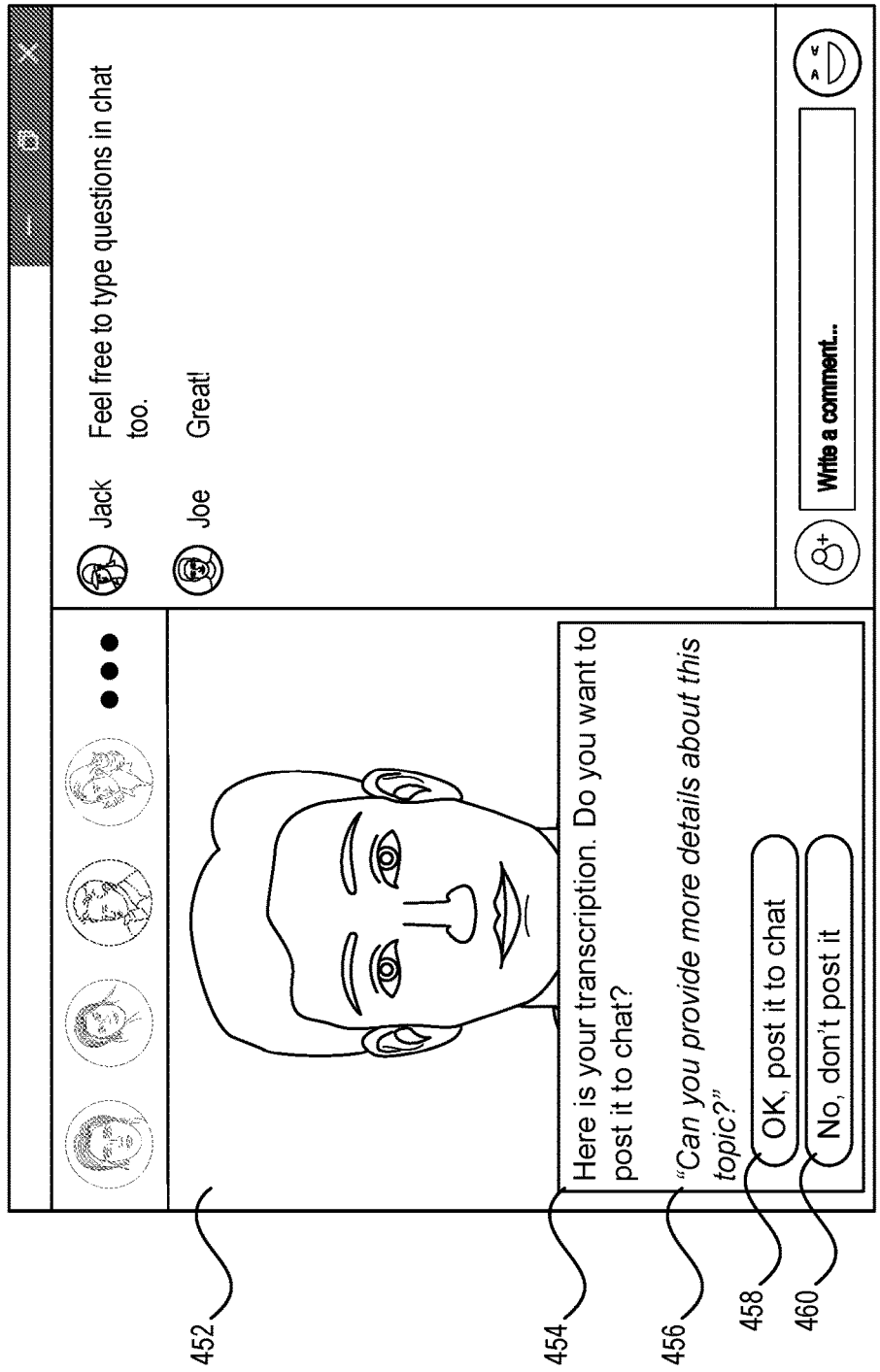

FIG. 4D illustrates an example interface 450, according to an embodiment of the present technology. In some cases, the example interface 450 can be provided in response to a selection by a user of the second option 410 in FIG. 4A to transcribe audio provided by the user and provide the transcription in chat. The example interface 450 can be presented to a user who was muted. In this example, the example interface 450 provides a video 452 of the ongoing communication session. The example interface 450 also includes a notification 454 that indicates that the transcription of the audio provided by the user will be provided in chat. The notification 454 includes a preview 456 of the transcription of the audio provided by the user. The notification 454 includes a first option 458 to confirm the decision to provide the transcription in chat. The notification 454 also includes a second option 460 to decline providing the transcription in chat.

Figure 4E:
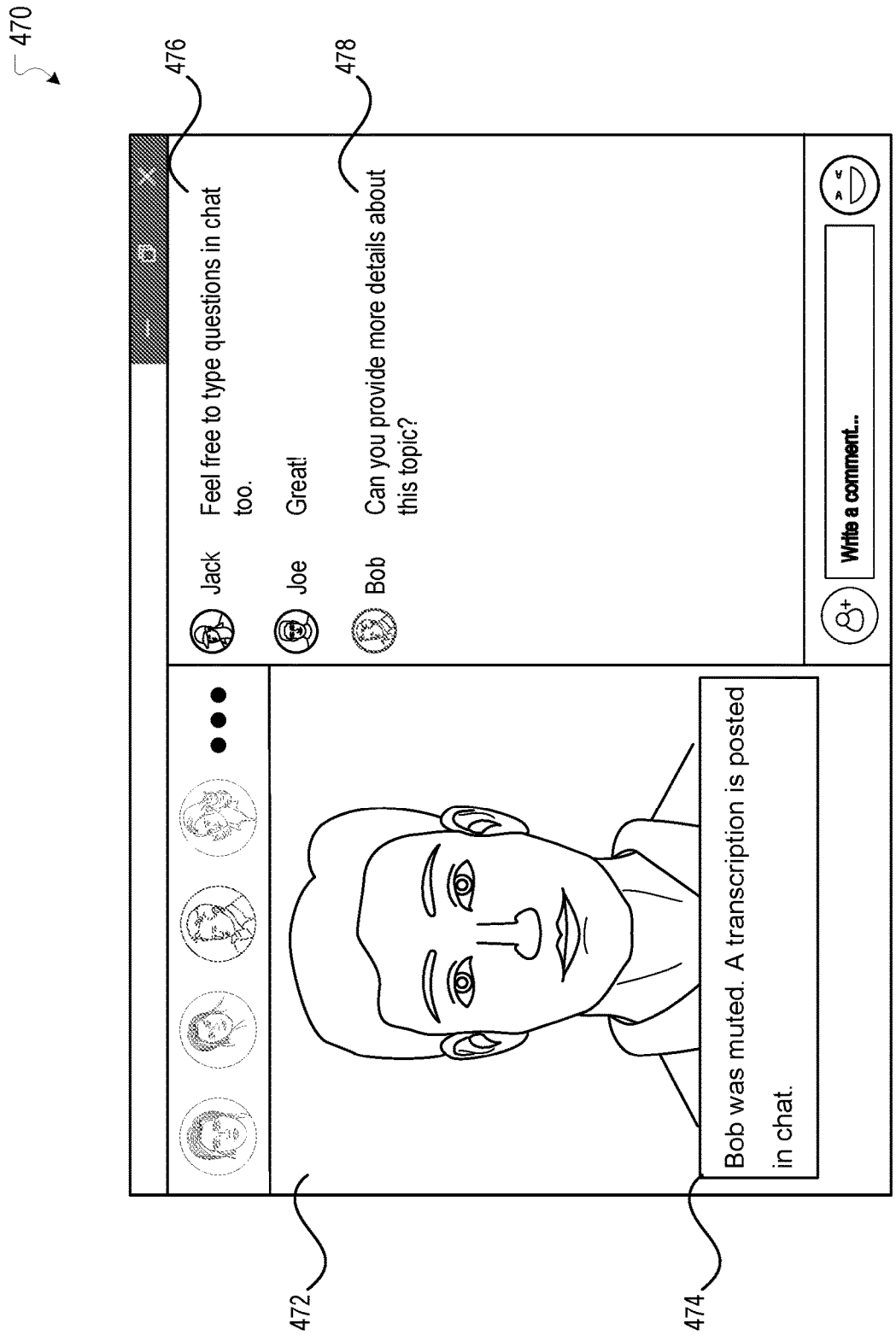

FIG. 4E illustrates an example interface 470, according to an embodiment of the present technology. In some cases, the example interface 470 can be provided in response to a selection by a user of the first option 458 in FIG. 4D to transcribe audio provided by the user and provide the transcription in chat 476. The example interface 470 can be provided to other users in a communication session with the user. In this example, the example interface 470 can include a video 472 of the ongoing communication session. The example interface 470 can include a notification 474 indicating that the user was muted and that a transcription 478 of the audio provided by the user has been provided in chat 476. The transcription 478 of the audio is provided in the chat 476.

Figure 4F:
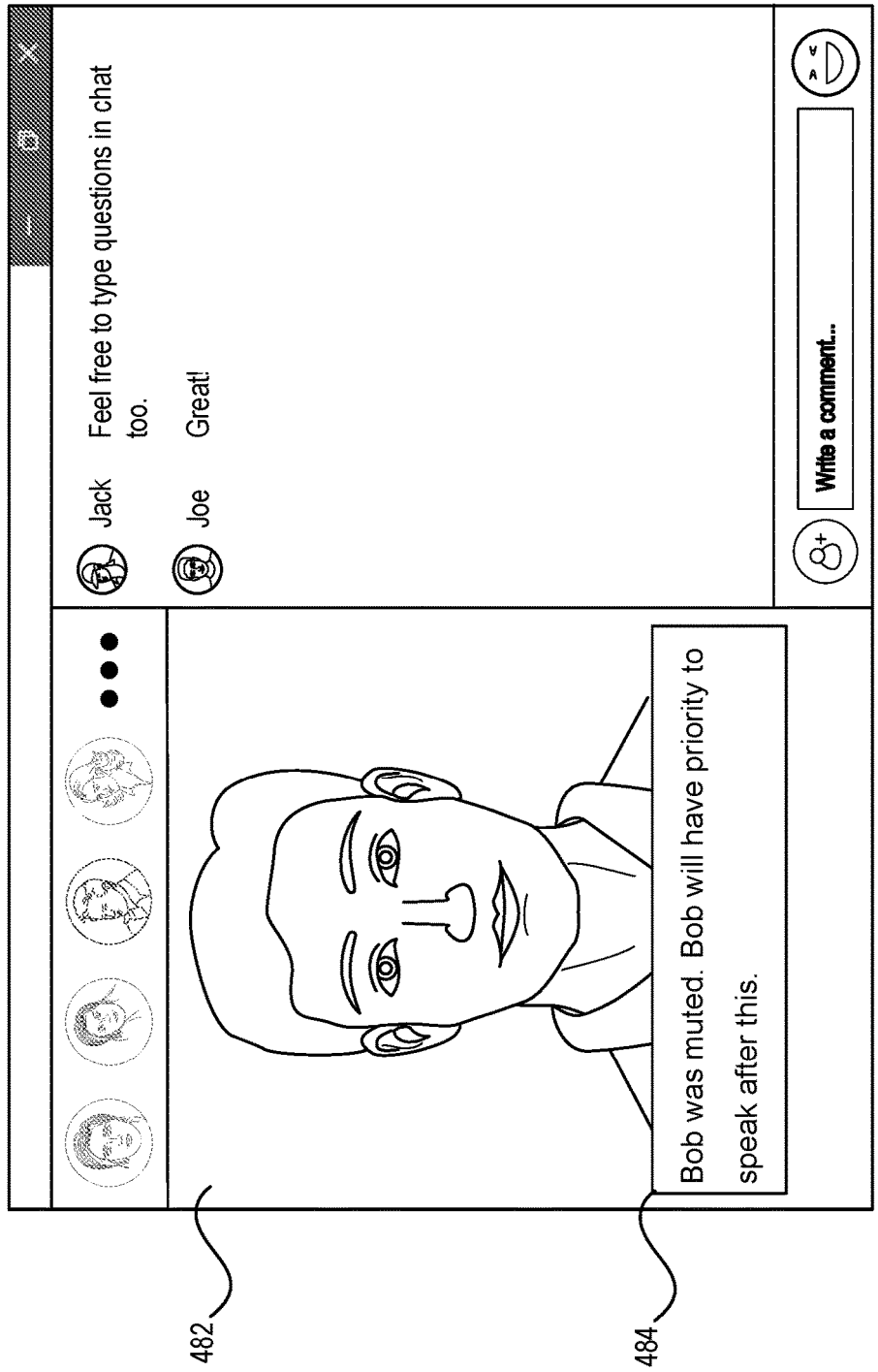

FIG. 4F illustrates an example interface 480, according to an embodiment of the present technology. In some cases, the example interface 480 can be provided in response to a selection by a user of the third option 412 in FIG. 4A to not play a recording of audio provided by the user and not provide a transcription of the audio. The example interface 480 can be provided to other users in a communication session with the user. In this example, the user can have priority to speak after the current speaker is finished speaking. The example interface 480 can include a video 482 of the ongoing communication session. The example interface 480 can include a notification 484 indicating that the user was muted and will have priority to speak after the current speaker is finished speaking. All examples herein are provided for illustrative purposes, and there can be many variations and other possibilities.

Figure 5:
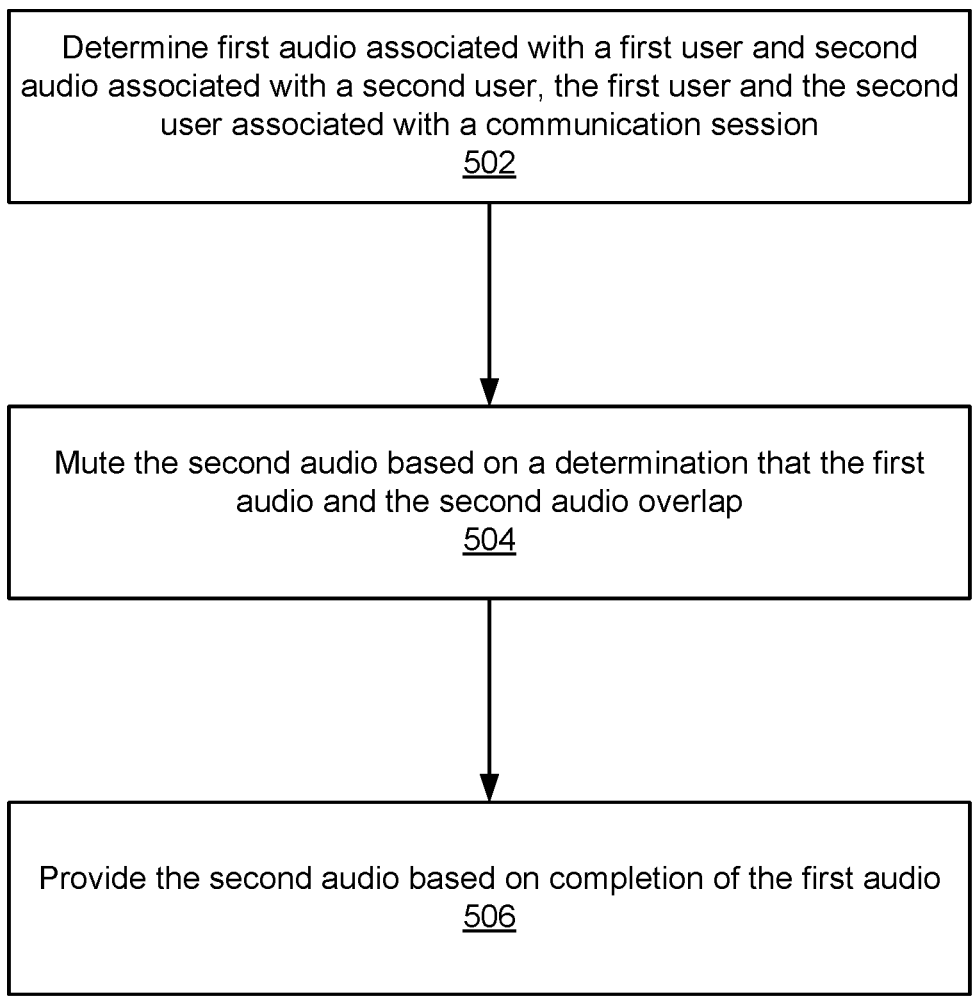
FIG. 5 illustrates an example method, according to an embodiment of the present technology.

FIG. 5 illustrates an example method 500, according to an embodiment of the present technology. It should be understood that there can be additional, fewer, or alternative steps performed in similar or alternative orders, or in parallel, based on the various features and embodiments discussed herein unless otherwise stated. At block 502, the example method 500 determines first audio associated with a first user and second audio associated with a second user, the first user and the second user associated with a communication session. At block 504, the example method 500 mutes the second audio based on a determination that the first audio and the second audio overlap. At block 506, the example method 500 provides the second audio based on completion of the first audio.

It is contemplated that there can be many other uses, applications, and/or variations associated with the various embodiments of the present technology. For example, in some cases, a user can choose whether or not to opt-in to utilize the present technology. The present technology can also ensure that various privacy settings and preferences are maintained and can prevent private information from being divulged. In another example, various embodiments of the present technology can learn, improve, and/or be refined over time.

Social Networking System—Example Implementation

Figure 6:
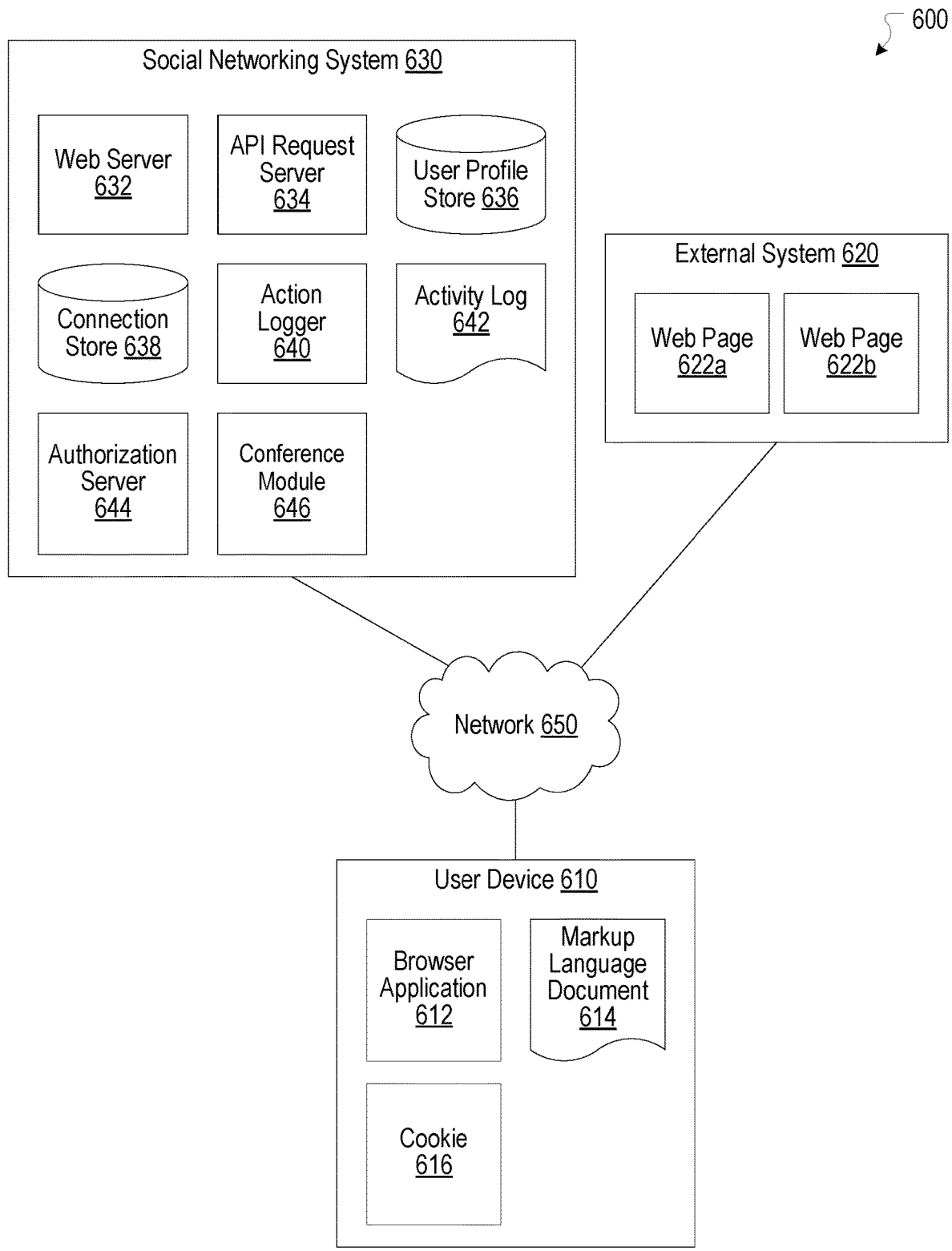
FIG. 6 illustrates a network diagram of an example system including an example social networking system that can be utilized in various scenarios, according to an embodiment of the present technology.

FIG. 6 illustrates a network diagram of an example system 600 that can be utilized in various scenarios, according to an embodiment of the present technology. The system 600 includes one or more user devices 610, one or more external systems 620, a social networking system (or service) 630, and a network 650. In an embodiment, the social networking service, provider, and/or system discussed in connection with the embodiments described above may be implemented as the social networking system 630. For purposes of illustration, the embodiment of the system 600, shown by FIG. 6, includes a single external system 620 and a single user device 610. However, in other embodiments, the system 600 may include more user devices 610 and/or more external systems 620. In certain embodiments, the social networking system 630 is operated by a social network provider, whereas the external systems 620 are separate from the social networking system 630 in that they may be operated by different entities. In various embodiments, however, the social networking system 630 and the external systems 620 operate in conjunction to provide social networking services to users (or members) of the social networking system 630. In this sense, the social networking system 630 provides a platform or backbone, which other systems, such as external systems 620, may use to provide social networking services and functionalities to users across the Internet.

The user device 610 comprises one or more computing devices that can receive input from a user and transmit and receive data via the network 650. In one embodiment, the user device 610 is a conventional computer system executing, for example, a Microsoft Windows compatible operating system (OS), Apple OS X, and/or a Linux distribution. In another embodiment, the user device 610 can be a device having computer functionality, such as a smart-phone, a tablet, a personal digital assistant (PDA), a mobile telephone, etc. The user device 610 is configured to communicate via the network 650. The user device 610 can execute an application, for example, a browser application that allows a user of the user device 610 to interact with the social networking system 630. In another embodiment, the user device 610 interacts with the social networking system 630 through an application programming interface (API) provided by the native operating system of the user device 610, such as iOS and ANDROID. The user device 610 is configured to communicate with the external system 620 and the social networking system 630 via the network 650, which may comprise any combination of local area and/or wide area networks, using wired and/or wireless communication systems.

In one embodiment, the network 650 uses standard communications technologies and protocols. Thus, the network 650 can include links using technologies such as Ethernet, 802.11, worldwide interoperability for microwave access (WiMAX), 3G, 4G, CDMA, GSM, LTE, digital subscriber line (DSL), etc. Similarly, the networking protocols used on the network 650 can include multiprotocol label switching (MPLS), transmission control protocol/Internet protocol (TCP/IP), User Datagram Protocol (UDP), hypertext transport protocol (HTTP), simple mail transfer protocol (SMTP), file transfer protocol (FTP), and the like. The data exchanged over the network 650 can be represented using technologies and/or formats including hypertext markup language (HTML) and extensible markup language (XML). In addition, all or some links can be encrypted using conventional encryption technologies such as secure sockets layer (SSL), transport layer security (TLS), and Internet Protocol security (IPsec).

In one embodiment, the user device 610 may display content from the external system 620 and/or from the social networking system 630 by processing a markup language document 614 received from the external system 620 and from the social networking system 630 using a browser application 612. The markup language document 614 identifies content and one or more instructions describing formatting or presentation of the content. By executing the instructions included in the markup language document 614, the browser application 612 displays the identified content using the format or presentation described by the markup language document 614. For example, the markup language document 614 includes instructions for generating and displaying a web page having multiple frames that include text and/or image data retrieved from the external system 620 and the social networking system 630. In various embodiments, the markup language document 614 comprises a data file including extensible markup language (XML) data, extensible hypertext markup language (XHTML) data, or other markup language data. Additionally, the markup language document 614 may include JavaScript Object Notation (JSON) data, JSON with padding (JSONP), and JavaScript data to facilitate data-interchange between the external system 620 and the user device 610. The browser application 612 on the user device 610 may use a JavaScript compiler to decode the markup language document 614.

The markup language document 614 may also include, or link to, applications or application frameworks such as FLASH™ or Unity™ applications, the SilverLight™ application framework, etc.

In one embodiment, the user device 610 also includes one or more cookies 616 including data indicating whether a user of the user device 610 is logged into the social networking system 630, which may enable modification of the data communicated from the social networking system 630 to the user device 610.

The external system 620 includes one or more web servers that include one or more web pages 622a, 622b, which are communicated to the user device 610 using the network 650. The external system 620 is separate from the social networking system 630. For example, the external system 620 is associated with a first domain, while the social networking system 630 is associated with a separate social networking domain. Web pages 622a, 622b, included in the external system 620, comprise markup language documents 614 identifying content and including instructions specifying formatting or presentation of the identified content.

The social networking system 630 includes one or more computing devices for a social network, including a plurality of users, and providing users of the social network with the ability to communicate and interact with other users of the social network. In some instances, the social network can be represented by a graph, i.e., a data structure including edges and nodes. Other data structures can also be used to represent the social network, including but not limited to databases, objects, classes, meta elements, files, or any other data structure. The social networking system 630 may be administered, managed, or controlled by an operator. The operator of the social networking system 630 may be a human being, an automated application, or a series of applications for managing content, regulating policies, and collecting usage metrics within the social networking system 630. Any type of operator may be used.

Users may join the social networking system 630 and then add connections to any number of other users of the social networking system 630 to whom they desire to be connected. As used herein, the term "friend" refers to any other user of the social networking system 630 to whom a user has formed a connection, association, or relationship via the social networking system 630. For example, in an embodiment, if users in the social networking system 630 are represented as nodes in the social graph, the term "friend" can refer to an edge formed between and directly connecting two user nodes.

Connections may be added explicitly by a user or may be automatically created by the social networking system 630 based on common characteristics of the users (e.g., users who are alumni of the same educational institution). For example, a first user specifically selects a particular other user to be a friend. Connections in the social networking system 630 are usually in both directions, but need not be, so the terms "user" and "friend" depend on the frame of reference. Connections between users of the social networking system 630 are usually bilateral ("two-way"), or "mutual," but connections may also be unilateral, or "one-way." For example, if Bob and Joe are both users of the social networking system 630 and connected to each other, Bob and Joe are each other's connections. If, on the other hand, Bob wishes to connect to Joe to view data communicated to the social networking system 630 by Joe, but Joe does not wish to form a mutual connection, a unilateral connection may be established. The connection between users may be a direct connection; however, some embodiments of the social networking system 630 allow the connection to be indirect via one or more levels of connections or degrees of separation.

In addition to establishing and maintaining connections between users and allowing interactions between users, the social networking system 630 provides users with the ability to take actions on various types of items supported by the social networking system 630. These items may include groups or networks (i.e., social networks of people, entities, and concepts) to which users of the social networking system 630 may belong, events or calendar entries in which a user might be interested, computer-based applications that a user may use via the social networking system 630, transactions that allow users to buy or sell items via services provided by or through the social networking system 630, and interactions with advertisements that a user may perform on or off the social networking system 630. These are just a few examples of the items upon which a user may act on the social networking system 630, and many others are possible. A user may interact with anything that is capable of being represented in the social networking system 630 or in the external system 620, separate from the social networking system 630, or coupled to the social networking system 630 via the network 650.

The social networking system 630 is also capable of linking a variety of entities. For example, the social networking system 630 enables users to interact with each other as well as external systems 620 or other entities through an API, a web service, or other communication channels. The social networking system 630 generates and maintains the "social graph" comprising a plurality of nodes interconnected by a plurality of edges. Each node in the social graph may represent an entity that can act on another node and/or that can be acted on by another node. The social graph may include various types of nodes. Examples of types of nodes include users, non-person entities, content items, web pages, groups, activities, messages, concepts, and any other things that can be represented by an object in the social networking system 630. An edge between two nodes in the social graph may represent a particular kind of connection, or association, between the two nodes, which may result from node relationships or from an action that was performed by one of the nodes on the other node. In some cases, the edges between nodes can be weighted. The weight of an edge can represent an attribute associated with the edge, such as a strength of the connection or association between nodes. Different types of edges can be provided with different weights. For example, an edge created when one user "likes" another user may be given one weight, while an edge created when a user befriends another user may be given a different weight.

As an example, when a first user identifies a second user as a friend, an edge in the social graph is generated connecting a node representing the first user and a second node representing the second user. As various nodes relate or interact with each other, the social networking system 630 modifies edges connecting the various nodes to reflect the relationships and interactions.

The social networking system 630 also includes user-generated content, which enhances a user's interactions with the social networking system 630. User-generated content may include anything a user can add, upload, send, or "post" to the social networking system 630. For example, a user communicates posts to the social networking system 630 from a user device 610. Posts may include data such as status updates or other textual data, location information, images such as photos, videos, links, music or other similar data and/or media. Content may also be added to the social networking system 630 by a third party. Content "items" are represented as objects in the social networking system 630. In this way, users of the social networking system 630 are encouraged to communicate with each other by posting text and content items of various types of media through various communication channels. Such communication increases the interaction of users with each other and increases the frequency with which users interact with the social networking system 630.

The social networking system 630 includes a web server 632, an API request server 634, a user profile store 636, a connection store 638, an action logger 640, an activity log 642, and an authorization server 644. In an embodiment of the invention, the social networking system 630 may include additional, fewer, or different components for various applications. Other components, such as network interfaces, security mechanisms, load balancers, failover servers, management and network operations consoles, and the like are not shown so as to not obscure the details of the system.

The user profile store 636 maintains information about user accounts, including biographic, demographic, and other types of descriptive information, such as work experience, educational history, hobbies or preferences, location, and the like that has been declared by users or inferred by the social networking system 630. This information is stored in the user profile store 636 such that each user is uniquely identified. The social networking system 630 also stores data describing one or more connections between different users in the connection store 638. The connection information may indicate users who have similar or common work experience, group memberships, hobbies, or educational history. Additionally, the social networking system 630 includes user-defined connections between different users, allowing users to specify their relationships with other users. For example, user-defined connections allow users to generate relationships with other users that parallel the users' real-life relationships, such as friends, co-workers, partners, and so forth. Users may select from predefined types of connections, or define their own connection types as needed. Connections with other nodes in the social networking system 630, such as non-person entities, buckets, cluster centers, images, interests, pages, external systems, concepts, and the like are also stored in the connection store 638.

The social networking system 630 maintains data about objects with which a user may interact. To maintain this data, the user profile store 636 and the connection store 638 store instances of the corresponding type of objects maintained by the social networking system 630. Each object type has information fields that are suitable for storing information appropriate to the type of object. For example, the user profile store 636 contains data structures with fields suitable for describing a user's account and information related to a user's account. When a new object of a particular type is created, the social networking system 630 initializes a new data structure of the corresponding type, assigns a unique object identifier to it, and begins to add data to the object as needed. This might occur, for example, when a user becomes a user of the social networking system 630, the social networking system 630 generates a new instance of a user profile in the user profile store 636, assigns a unique identifier to the user account, and begins to populate the fields of the user account with information provided by the user.

The connection store 638 includes data structures suitable for describing a user's connections to other users, connections to external systems 620 or connections to other entities.

The connection store 638 may also associate a connection type with a user's connections, which may be used in conjunction with the user's privacy setting to regulate access to information about the user. In an embodiment of the invention, the user profile store 636 and the connection store 638 may be implemented as a federated database.

Data stored in the connection store 638, the user profile store 636, and the activity log 642 enables the social networking system 630 to generate the social graph that uses nodes to identify various objects and edges connecting nodes to identify relationships between different objects. For example, if a first user establishes a connection with a second user in the social networking system 630, user accounts of the first user and the second user from the user profile store 636 may act as nodes in the social graph. The connection between the first user and the second user stored by the connection store 638 is an edge between the nodes associated with the first user and the second user. Continuing this example, the second user may then send the first user a message within the social networking system 630. The action of sending the message, which may be stored, is another edge between the two nodes in the social graph representing the first user and the second user. Additionally, the message itself may be identified and included in the social graph as another node connected to the nodes representing the first user and the second user.

In another example, a first user may tag a second user in an image that is maintained by the social networking system 630 (or, alternatively, in an image maintained by another system outside of the social networking system 630). The image may itself be represented as a node in the social networking system 630. This tagging action may create edges between the first user and the second user as well as create an edge between each of the users and the image, which is also a node in the social graph. In yet another example, if a user confirms attending an event, the user and the event are nodes obtained from the user profile store 636, where the attendance of the event is an edge between the nodes that may be retrieved from the activity log 642. By generating and maintaining the social graph, the social networking system 630 includes data describing many different types of objects and the interactions and connections among those objects, providing a rich source of socially relevant information.

The web server 632 links the social networking system 630 to one or more user devices 610 and/or one or more external systems 620 via the network 650. The web server 632 serves web pages, as well as other web-related content, such as Java, JavaScript, Flash, XML, and so forth. The web server 632 may include a mail server or other messaging functionality for receiving and routing messages between the social networking system 630 and one or more user devices 610. The messages can be instant messages, queued messages (e.g., email), text and SMS messages, or any other suitable messaging format.

The API request server 634 allows one or more external systems 620 and user devices 610 to call access information from the social networking system 630 by calling one or more API functions. The API request server 634 may also allow external systems 620 to send information to the social networking system 630 by calling APIs. The external system 620, in one embodiment, sends an API request to the social networking system 630 via the network 650, and the API request server 634 receives the API request. The API request server 634 processes the request by calling an API associated with the API request to generate an appropriate response, which the API request server 634 communicates to the external system 620 via the network 650. For example, responsive to an API request, the API request server 634 collects data associated with a user, such as the user's connections that have logged into the external system 620, and communicates the collected data to the external system 620. In another embodiment, the user device 610 communicates with the social networking system 630 via APIs in the same manner as external systems 620.

The action logger 640 is capable of receiving communications from the web server 632 about user actions on and/or off the social networking system 630. The action logger 640 populates the activity log 642 with information about user actions, enabling the social networking system 630 to discover various actions taken by its users within the social networking system 630 and outside of the social networking system 630. Any action that a particular user takes with respect to another node on the social networking system 630 may be associated with each user's account, through information maintained in the activity log 642 or in a similar database or other data repository. Examples of actions taken by a user within the social networking system 630 that are identified and stored may include, for example, adding a connection to another user, sending a message to another user, reading a message from another user, viewing content associated with another user, attending an event posted by another user, posting an image, attempting to post an image, or other actions interacting with another user or another object. When a user takes an action within the social networking system 630, the action is recorded in the activity log 642. In one embodiment, the social networking system 630 maintains the activity log 642 as a database of entries. When an action is taken within the social networking system 630, an entry for the action is added to the activity log 642. The activity log 642 may be referred to as an action log.

Additionally, user actions may be associated with concepts and actions that occur within an entity outside of the social networking system 630, such as an external system 620 that is separate from the social networking system 630. For example, the action logger 640 may receive data describing a user's interaction with an external system 620 from the web server 632. In this example, the external system 620 reports a user's interaction according to structured actions and objects in the social graph.

Other examples of actions where a user interacts with an external system 620 include a user expressing an interest in an external system 620 or another entity, a user posting a comment to the social networking system 630 that discusses an external system 620 or a web page 622a within the external system 620, a user posting to the social networking system 630 a Uniform Resource Locator (URL) or other identifier associated with an external system 620, a user attending an event associated with an external system 620, or any other action by a user that is related to an external system 620. Thus, the activity log 642 may include actions describing interactions between a user of the social networking system 630 and an external system 620 that is separate from the social networking system 630.

The authorization server 644 enforces one or more privacy settings of the users of the social networking system 630. A privacy setting of a user determines how particular information associated with a user can be shared. The privacy setting comprises the specification of particular information associated with a user and the specification of the entity or entities with whom the information can be shared. Examples of entities with which information can be shared may include other users, applications, external systems 620, or any entity that can potentially access the information. The information that can be shared by a user comprises user account information, such as profile photos, phone numbers associated with the user, user's connections, actions taken by the user such as adding a connection, changing user profile information, and the like.

The privacy setting specification may be provided at different levels of granularity. For example, the privacy setting may identify specific information to be shared with other users; the privacy setting identifies a work phone number or a specific set of related information, such as, personal information including profile photo, home phone number, and status. Alternatively, the privacy setting may apply to all the information associated with the user. The specification of the set of entities that can access particular information can also be specified at various levels of granularity. Various sets of entities with which information can be shared may include, for example, all friends of the user, all friends of friends, all applications, or all external systems 620. One embodiment allows the specification of the set of entities to comprise an enumeration of entities. For example, the user may provide a list of external systems 620 that are allowed to access certain information. Another embodiment allows the specification to comprise a set of entities along with exceptions that are not allowed to access the information. For example, a user may allow all external systems 620 to access the user's work information, but specify a list of external systems 620 that are not allowed to access the work information. Certain embodiments call the list of exceptions that are not allowed to access certain information a "block list". External systems 620 belonging to a block list specified by a user are blocked from accessing the information specified in the privacy setting. Various combinations of granularity of specification of information, and granularity of specification of entities, with which information is shared are possible. For example, all personal information may be shared with friends whereas all work information may be shared with friends of friends.

The authorization server 644 contains logic to determine if certain information associated with a user can be accessed by a user's friends, external systems 620, and/or other applications and entities. The external system 620 may need authorization from the authorization server 644 to access the user's more private and sensitive information, such as the user's work phone number. Based on the user's privacy settings, the authorization server 644 determines if another user, the external system 620, an application, or another entity is allowed to access information associated with the user, including information about actions taken by the user.

In some embodiments, the social networking system 630 can include a conference module 646. The conference module 646 can be implemented with the conference module 102, as discussed in more detail herein. In various embodiments, some or all functionality of the conference module 102 can be additionally or alternatively implemented by the user device 610. It should be appreciated that there can be many variations or other possibilities.

Hardware Implementation

Figure 7:
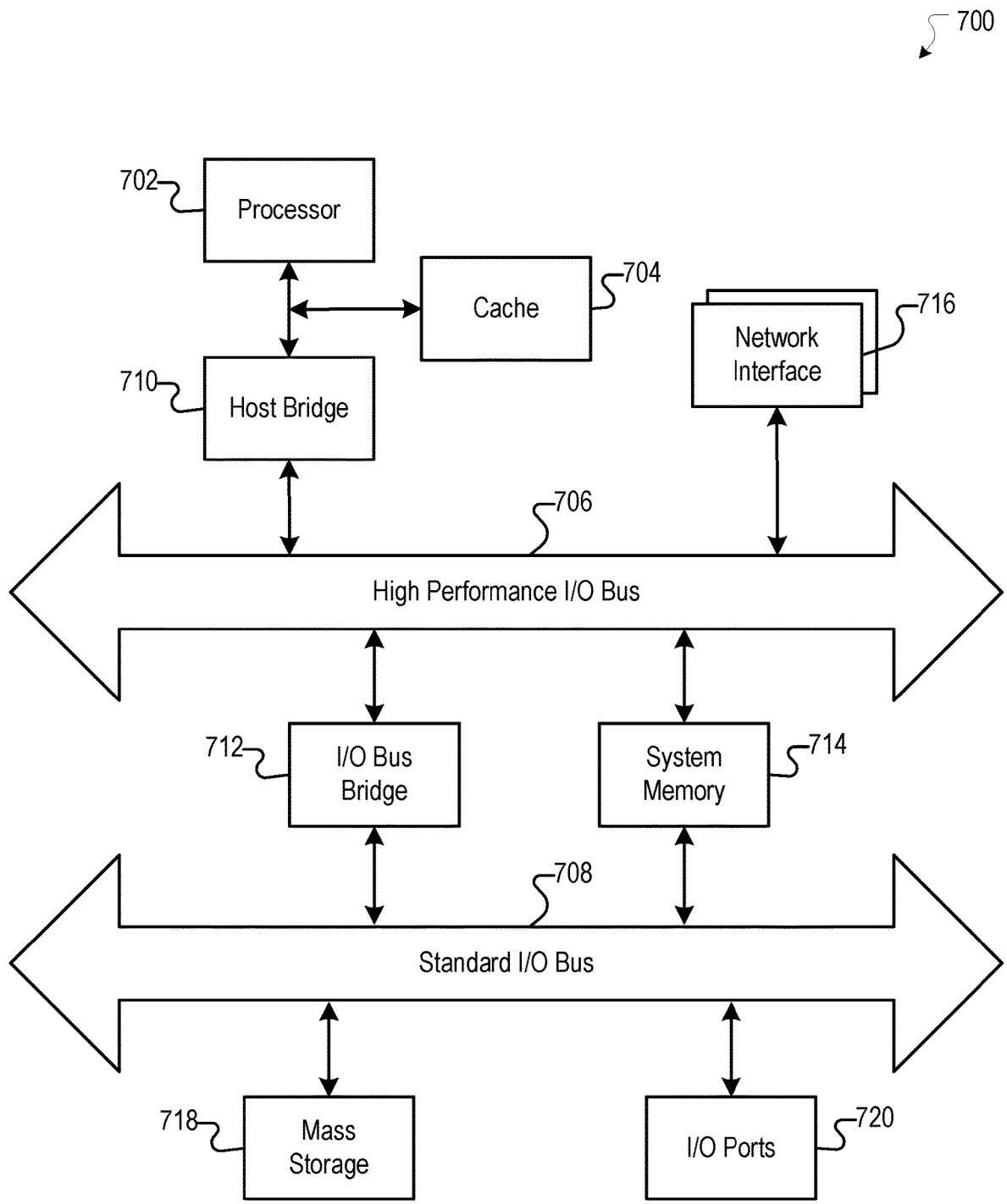
FIG. 7 illustrates an example of a computer system or computing device that can be utilized in various scenarios, according to an embodiment of the present technology.

The foregoing processes and features can be implemented by a wide variety of machine and computer system architectures and in a wide variety of network and computing environments. FIG. 7 illustrates an example of a computer system 700 that may be used to implement one or more of the embodiments described herein according to an embodiment of the invention. The computer system 700 includes sets of instructions for causing the computer system 700 to perform the processes and features discussed herein. The computer system 700 may be connected (e.g., networked) to other machines. In a networked deployment, the computer system 700 may operate in the capacity of a server machine or a client machine in a client-server network environment, or as a peer machine in a peer-to-peer (or distributed) network environment. In an embodiment of the invention, the computer system 700 may be the social networking system 630, the user device 610, and the external system 620, or a component thereof. In an embodiment of the invention, the computer system 700 may be one server among many that constitutes all or part of the social networking system 630.

The computer system 700 includes a processor 702, a cache 704, and one or more executable modules and drivers, stored on a computer-readable medium, directed to the processes and features described herein. Additionally, the computer system 700 includes a high performance input/output (I/O) bus 706 and a standard I/O bus 708. A host bridge 710 couples processor 702 to high performance I/O bus 706, whereas I/O bus bridge 712 couples the two buses 706 and 708 to each other. A system memory 714 and one or more network interfaces 716 couple to high performance I/O bus 706. The computer system 700 may further include video memory and a display device coupled to the video memory (not shown). Mass storage 718 and I/O ports 720 couple to the standard I/O bus 708. The computer system 700 may optionally include a keyboard and pointing device, a display device, or other input/output devices (not shown) coupled to the standard I/O bus 708. Collectively, these elements are intended to represent a broad category of computer hardware systems, including but not limited to computer systems based on the x86-compatible processors manufactured by Intel Corporation of Santa Clara, Calif., and the x86-compatible processors manufactured by Advanced Micro Devices (AMD), Inc., of Sunnyvale, Calif., as well as any other suitable processor.

An operating system manages and controls the operation of the computer system 700, including the input and output of data to and from software applications (not shown). The operating system provides an interface between the software applications being executed on the system and the hardware components of the system. Any suitable operating system may be used, such as the LINUX Operating System, the Apple Macintosh Operating System, available from Apple Computer Inc. of Cupertino, Calif., UNIX operating systems, Microsoft® Windows® operating systems, BSD operating systems, and the like. Other implementations are possible.

The elements of the computer system 700 are described in greater detail below. In particular, the network interface 716 provides communication between the computer system 700 and any of a wide range of networks, such as an Ethernet (e.g., IEEE 802.3) network, a backplane, etc. The mass storage 718 provides permanent storage for the data and programming instructions to perform the above-described processes and features implemented by the respective computing systems identified above, whereas the system memory 714 (e.g., DRAM) provides temporary storage for the data and programming instructions when executed by the processor 702. The I/O ports 720 may be one or more serial and/or parallel communication ports that provide communication between additional peripheral devices, which may be coupled to the computer system 700.

The computer system 700 may include a variety of system architectures, and various components of the computer system 700 may be rearranged. For example, the cache 704 may be on-chip with processor 702. Alternatively, the cache 704 and the processor 702 may be packed together as a "processor module", with processor 702 being referred to as the "processor core". Furthermore, certain embodiments of the invention may neither require nor include all of the above components. For example, peripheral devices coupled to the standard I/O bus 708 may couple to the high performance I/O bus 706. In addition, in some embodiments, only a single bus may exist, with the components of the computer system 700 being coupled to the single bus. Moreover, the computer system 700 may include additional components, such as additional processors, storage devices, or memories.

In general, the processes and features described herein may be implemented as part of an operating system or a specific application, component, program, object, module, or series of instructions referred to as "programs". For example, one or more programs may be used to execute specific processes described herein. The programs typically comprise one or more instructions in various memory and storage devices in the computer system 700 that, when read and executed by one or more processors, cause the computer system 700 to perform operations to execute the processes and features described herein. The processes and features described herein may be implemented in software, firmware, hardware (e.g., an application specific integrated circuit), or any combination thereof.

In one implementation, the processes and features described herein are implemented as a series of executable modules run by the computer system 700, individually or collectively in a distributed computing environment. The foregoing modules may be realized by hardware, executable modules stored on a computer-readable medium (or machine-readable medium), or a combination of both. For example, the modules may comprise a plurality or series of instructions to be executed by a processor in a hardware system, such as the processor 702. Initially, the series of instructions may be stored on a storage device, such as the mass storage 718. However, the series of instructions can be stored on any suitable computer readable storage medium. Furthermore, the series of instructions need not be stored locally, and could be received from a remote storage device, such as a server on a network, via the network interface 716. The instructions are copied from the storage device, such as the mass storage 718, into the system memory 714 and then accessed and executed by the processor 702. In various implementations, a module or modules can be executed by a processor or multiple processors in one or multiple locations, such as multiple servers in a parallel processing environment.

Examples of computer-readable media include, but are not limited to, recordable type media such as volatile and non-volatile memory devices; solid state memories; floppy and other removable disks; hard disk drives; magnetic media; optical disks (e.g., Compact Disk Read-Only Memory (CD ROMS), Digital Versatile Disks (DVDs)); other similar non-transitory (or transitory), tangible (or non-tangible) storage medium; or any type of medium suitable for storing, encoding, or carrying a series of instructions for execution by the computer system 700 to perform any one or more of the processes and features described herein.

For purposes of explanation, numerous specific details are set forth in order to provide a thorough understanding of the description. It will be apparent, however, to one skilled in the art that embodiments of the technology can be practiced without these specific details. In some instances, modules, structures, processes, features, and devices are shown in block diagram form in order to avoid obscuring the description. In other instances, functional block diagrams and flow diagrams are shown to represent data and logic flows. The components of block diagrams and flow diagrams (e.g., modules, blocks, structures, devices, features, etc.) may be variously combined, separated, removed, reordered, and replaced in a manner other than as expressly described and depicted herein.

Reference in this specification to "one embodiment", "an embodiment", "other embodiments", "one series of embodiments", "some embodiments", "various embodiments", or the like means that a particular feature, design, structure, or characteristic described in connection with the embodiment is included in at least one embodiment of the present technology. The appearances of, for example, the phrase "in one embodiment" or "in an embodiment" in various places in the specification are not necessarily all referring to the same embodiment, nor are separate or alternative embodiments mutually exclusive of other embodiments. Moreover, whether or not there is express reference to an "embodiment" or the like, various features are described, which may be variously combined and included in some embodiments, but also variously omitted in other embodiments. Similarly, various features are described that may be preferences or requirements for some embodiments, but not other embodiments.

The language used herein has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A computer-implemented method comprising:
   determining, by a computing system, first audio associated with a first user and second audio associated with a second user, the first user and the second user associated with a communication session;
   determining, by the computing system, a first number of times the first user was prioritized in the communication session and a second number of times the second user was prioritized in the communication session;
   muting, by the computing system, the second audio based on a determination that the first audio and the second audio overlap and the first number of times the first user was prioritized is less than the second number of times the second user was prioritized;
   providing, by the computing system, a first notification for the second user with a first option to provide a transcription of the second audio;
   providing, by the computing system, the transcription of the second audio based on a selection of the first option by the second user.

2. The computer-implemented method of claim 1, wherein the muting the second audio is further based on a first topic associated with the first audio and a second topic associated with the second audio.

3. The computer-implemented method of claim 2, wherein the first topic is determined based on first speech included in the first audio, the second topic is determined based on second speech included in the second audio, and the first topic is determined to be more similar to a topic of a discussion associated with the communication session than the second topic.

4. The computer-implemented method of claim 1, wherein the muting the second audio is further based on first user information associated with the first user and second user information associated with the second user.

5. The computer-implemented method of claim 1, wherein the muting the second audio is further based on a first frequency with which the first user speaks in the communication session and a second frequency with which the second user speaks in the communication session, and wherein the second frequency is higher than the first frequency.

6. The computer-implemented method of claim 1, wherein the muting the second audio is further based on a first time associated with the first audio and a second time associated with the second audio, and wherein the first time is earlier than the second time.

7. The computer-implemented method of claim 1, wherein the transcription of the second audio is provided in a chat associated with the communication session.

8. The computer-implemented method of claim 1, further comprising providing a second notification for users associated with the communication session that a recording of the second audio will be provided.

9. The computer-implemented method of claim 1, further comprising providing the second audio in the communication session based on a selection of a second option by the second user.

10. The computer-implemented method of claim 1, wherein the second audio is prioritized over audio of users associated with the communication session after the completion of the first audio.

11. A system comprising:
    at least one processor; and
    a memory storing instructions that, when executed by the at least one processor, cause the system to perform operations comprising:
        determining first audio associated with a first user and second audio associated with a second user, the first user and the second user associated with a communication session;
        determining a first number of times the first user was prioritized in the communication session and a second number of times the second user was prioritized in the communication session;
        muting the second audio based on a determination that the first audio and the second audio overlap and the first number of times the first user was prioritized is less than the second number of times the second user was prioritized;
        providing a first notification for the second user with a first option to provide a transcription of the second audio;
        providing the transcription of the second audio based on a selection of the first option by the second user.

12. The system of claim 11, wherein the muting the second audio is further based on a first topic associated with the first audio and a second topic associated with the second audio.

13. The system of claim 12, wherein the first topic is determined based on first speech included in the first audio, the second topic is determined based on second speech included in the second audio, and the first topic is determined to more similar to a topic of a discussion associated with the communication session than the second topic.

14. The system of claim 11, wherein the muting the second audio is further based on first user information associated with the first user and second user information associated with the second user.

15. The system of claim 11, wherein the muting the second audio is further based on a first frequency with which the first user speaks in the communication session and a second frequency with which the second user speaks in the communication session, and wherein the second frequency is higher than the first frequency.

16. A non-transitory computer-readable storage medium including instructions that, when executed by at least one processor of a computing system, cause the computing system to perform operations comprising:
    determining first audio associated with a first user and second audio associated with a second user, the first user and the second user associated with a communication session;
    determining a first number of times the first user was prioritized in the communication session and a second number of times the second user was prioritized in the communication session;
    muting the second audio based on a determination that the first audio and the second audio overlap and the first number of times the first user was prioritized is less than the second number of times the second user was prioritized;
    providing a first notification for the second user with a first option to provide a transcription of the second audio;
    providing the transcription of the second audio based on a selection of the first option by the second user.

17. The non-transitory computer-readable storage medium of claim 16, wherein the muting the second audio is further based on a first topic associated with the first audio and a second topic associated with the second audio.

18. The non-transitory computer-readable storage medium of claim 17, wherein the first topic is determined based on first speech included in the first audio, the second topic is determined based on second speech included in the second audio, and the first topic is determined to be more similar to a topic of a discussion associated with the communication session than the second topic.

19. The non-transitory computer-readable storage medium of claim 16, wherein the muting the second audio is further based on first user information associated with the first user and second user information associated with the second user.

20. The non-transitory computer-readable storage medium of claim 16, wherein the muting the second audio is further based on a first frequency with which the first user speaks in the communication session and a second frequency with which the second user speaks in the communication session, and wherein the second frequency is higher than the first frequency.

* * * * *